US011518040B2

(12) United States Patent
Anderson et al.

(10) Patent No.: US 11,518,040 B2
(45) Date of Patent: Dec. 6, 2022

(54) GENERATIVE DESIGN TECHNIQUES FOR ROBOT BEHAVIOR

(71) Applicant: AUTODESK, INC., San Francisco, CA (US)

(72) Inventors: Fraser Anderson, Camrose (CA); Stelian Coros, Zurich (CH); Ruta Desai, Pittsburgh, PA (US); Tovi Grossman, Toronto (CA); Justin Frank Matejka, Newmarket (CA); George Fitzmaurice, Toronto (CA)

(73) Assignee: AUTODESK, INC., San Francisco, CA (US)

( * ) Notice: Subject to any disclaimer, the term of this patent is extended or adjusted under 35 U.S.C. 154(b) by 796 days.

(21) Appl. No.: 16/134,864

(22) Filed: Sep. 18, 2018

(65) Prior Publication Data

US 2020/0034514 A1    Jan. 30, 2020

Related U.S. Application Data

(60) Provisional application No. 62/711,436, filed on Jul. 27, 2018.

(51) Int. Cl.
*B25J 11/00* (2006.01)
*G06N 3/00* (2006.01)
(Continued)

(52) U.S. Cl.
CPC .............. *B25J 11/001* (2013.01); *G06F 30/17* (2020.01); *G06N 3/004* (2013.01); *G06N 3/008* (2013.01);
(Continued)

(58) Field of Classification Search
CPC ....... B25J 11/001; B25J 19/007; G06N 20/00; G06N 3/004; G06N 3/008; G06N 3/08; G06N 5/003; G06N 7/005; G06F 30/17
(Continued)

(56) References Cited

U.S. PATENT DOCUMENTS 6,169,981 B1   1/2001 Werbos
2009/0106177 A1   4/2009 Kobayashi
(Continued)

OTHER PUBLICATIONS

Durupinar, Funda, et al. "Perform: Perceptual approach for adding ocean personality to human motion using laban movement analysis." ACM Transactions on Graphics (TOG) 36.1 (2016). pp. 1-16. (Year: 2016).*

(Continued)

*Primary Examiner* — John E Johansen
(74) *Attorney, Agent, or Firm* — Artegis Law Group, LLP

(57) ABSTRACT

An automated robot design pipeline facilitates the overall process of designing robots that perform various desired behaviors. The disclosed pipeline includes four stages. In the first stage, a generative engine samples a design space to generate a large number of robot designs. In the second stage, a metric engine generates behavioral metrics indicating a degree to which each robot design performs the desired behaviors. In the third stage, a mapping engine generates a behavior predictor that can predict the behavioral metrics for any given robot design. In the fourth stage, a design engine generates a graphical user interface (GUI) that guides the user in performing behavior-driven design of a robot. One advantage of the disclosed approach is that the user need not have specialized skills in either graphic design or programming to generate designs for robots that perform specific behaviors or express various emotions.

20 Claims, 23 Drawing Sheets

(51) Int. Cl.
    *G06F 30/17*     (2020.01)
    *G06N 3/08*     (2006.01)
    *G06N 5/00*     (2006.01)
    *G06N 20/00*     (2019.01)
    *G06N 7/00*     (2006.01)
    *B25J 19/00*     (2006.01)

(52) U.S. Cl.
    CPC ............... *G06N 3/08* (2013.01); *G06N 5/003* (2013.01); *G06N 7/005* (2013.01); *G06N 20/00* (2019.01); *B25J 19/007* (2013.01)

(58) Field of Classification Search
    USPC .......................................................... 703/7
    See application file for complete search history.

(56) References Cited

U.S. PATENT DOCUMENTS

| | | | |
|---|---|---|---|
| 2014/0153832 A1* | 6/2014 | Kwatra | G06T 11/00 382/195 |
| 2016/0170284 A1 | 6/2016 | Beatty | |
| 2017/0017212 A1 | 1/2017 | Collins | |
| 2017/0061319 A1 | 3/2017 | Mazzoldi | |
| 2019/0122409 A1* | 4/2019 | Meadows | G06N 3/02 |
| 2019/0251437 A1 | 8/2019 | Finn | |
| 2021/0205984 A1 | 7/2021 | Hafner | |

OTHER PUBLICATIONS

Jack, Rachael E., Oliver GB Garrod, and Philippe G. Schyns. "Dynamic facial expressions of emotion transmit an evolving hierarchy of signals over time." Current biology 24.2 (2014). pp. 187-192. (Year: 2014).*
Wang, Ziyu, et al. "Robust imitation of diverse behaviors." arXiv preprint arXiv:1707.02747 (2017). Archive Jul. 14, 2017. pp. 1-12. (Year: 2017).*
Alaerts et al., 2011. "Action and emotion recognition from point light displays: an investigation of gender differences", PloS one vol. 6, Issue 6, e20989, Jun. 2011, 9 pages.
Aneja et al., "Modeling Stylized Character Expressions via Deep Learning", Asian Conference on Computer Vision, Springer, 2016, pp. 136-153.
Barnes et al., "Video Puppetry: A Performative Interface for Cutout Animation", ACM SIGGRAPH Asia 2008 Papers (SIGGRAPH Asia '08), ACM, http://doi.org/10.1145/1457515.1409077, 2016, pp. 124:1-124:9.
Bartram et al., "What makes motion meaningful? Affective properties of abstract motion", Image and Video Technology (PSIVT), 2010 Fourth Pacific-Rim Symposium on, IEEE, pp. 468-474.
Breazeal et al., "Social robots that interact with people", In Springer handbook of robotics. Springer, 2008, 1349-1369.
Chaudhuri et al., "AttribIt: Content Creation with Semantic Attributes", . Proceedings of the 26th annual ACM symposium on User interface software and technology, ACM, Oct. 8-11, 2013, pp. 193-202.
Christiano et al., "Deep Reinforcement Learning from Human Preferences", Advances in Neural Information Processing Systems, 2017, pp. 4302-4310.
Ciccone et al., "Authoring motion cycles", Proceedings of the ACM SIGGRAPH/Eurographics Symposium on Computer Animation, ACM, Jul. 28-30, 2017, 9 pages.
Csató, László, "Ranking by pairwise comparisons for Swiss-system tournaments", Central European Journal of Operations Research 21, 4: 2013, pp. 783-803.
Dalibard et al., "Anthropomorphism of artificial agents: a comparative survey of expressive design and motion of virtual Characters and Social Robots", Workshop on Autonomous Social Robots and Virtual Humans at the 25th Annual Conference on Computer Animation and Social Agents (CASA 2012), 21 pages.

Dubey et al., "Deep Learning the City: Quantifying Urban Perception at a Global Scale", European Conference on Computer Vision, Springer, Sep. 12, 2016, 196-212.
Emeli, Victor, "Robot Learning Through Social Media Crowdsourcing", Intelligent Robots and Systems (IROS), 2012 IEEE/RSJ International Conference on, IEEE, Oct. 7-12, 2012, pp. 2332-2337.
Blender Foundation, "blender.org—Home of the Blender project—Free and Open 3D Creation Software", blender.org. Retrieved Apr. 4, 2018 from https://www.blender.org/, 23 pages.
Gallese et al., "A unifying view of the basis of social cognition", Trends in cognitive sciences vol. 8, No. 9: 2004, pp. 396-403.
Gannon, Madeline "Human-Centered Interfaces for Autonomous Fabrication Machines", Carnegie Mellon University, 2017, 198 pages.
Glauser et al., "Rig Animation with a Tangible and Modular Input Device", ACM Trans. Graph., vol. 35, No. 4, Article 144, DOI: http://dx.doi.org/10.1145/2897824.2925909, Jul. 2016, pp. 144:1-144:11.
Harris et al., "Exploring the affect of abstract motion in social human-robot interaction", RO-MAN, 2011 IEEE, pp. 441-448.
Herbrich et al., "TrueSkillTM: a Bayesian skill rating system", Advances in neural information processing systems, 2007, pp. 569-576.
Knight et al., "Laban Head-Motions Convey Robot State: A Call for Robot Body Language", 2016 IEEE International Conference on Robotics and Automation (ICRA), May 16-21, 2016, pp. 2881-2888.
Kovashka et al., "WhittleSearch: Image Search with Relative Attribute Feedback", Computer Vision and Pattern Recognition (CVPR), 2012 IEEE Conference on, IEEE, pp. 2973-2980.
Koyama et al., "OptiMo: Optimization-Guided Motion Editing for Keyframe Character Animation", 2018, 12 pages.
Koyama et al., "Crowd-Powered Parameter Analysis for Visual Design Exploration", Proceedings of the 27th annual ACM symposium on User interface software and technology, ACM, Oct. 5-8, 2014, pp. 65-74.
Laffont et al., "Transient Attributes for High-Level Understanding and Editing of Outdoor Scenes", ACM Transactions on Graphics (TOG) vol. 33, No. 4, 2014, 11 pages.
Lafreniere et al., "Crowdsourced Fabrication", Proceedings of the 29th Annual Symposium on User Interface Software and Technology, ACM, Oct. 16-19, 2016, pp. 15-28.
Lee et al., "Designing with Interactive Example Galleries", Proceedings of the SIGCHI Conference on Human Factors in Computing Systems, ACM, Apr. 10-15, 2010, pp. 2257-2266.
Lin et al., Evaluating Emotive Character Animations Created with Procedural Animation International Workshop on Intelligent Virtual Agents, Springer, 2009, pp. 308-315.
Matejka et al., "Dream Lens: Exploration and Visualization of Large-Scale Generative Design Datasets", SIGCHI (To appear), Apr. 21-26, 2018, 12 pages.
Megaro et al., "Interactive design of 3D-printable robotic creatures", ACM Transactions on Graphics, vol. 34, No. 6, Article 216, Nov. 2015, 9 pages.
Mok et al., "Empathy: Interactions with Emotive Robotic Drawers", Proceedings of the 2014 ACM/IEEE international conference on Human-robot interaction, ACM, Mar. 3-6, 2014, pp. 250-251.
Naik et al., "Streetscore—Predicting the Perceived Safety of One Million Streetscapes", Proceedings of the IEEE Conference on Computer Vision and Pattern Recognition Workshops, 2014, pp. 779-785.
O'Donovan et al., "Exploratory Font Selection Using Crowdsourced Attributes", ACM Transactions on Graphics, vol. 33, No. 4, Article 92, Jul. 2014, 9 pages.
Pan et al., "Unsupervised Hierarchical Modeling of Locomotion Styles", Proceedings of the 26th Annual International Conference on Machine Learning, ACM, 2009, pp. 785-792.
Parikh et al., "Relative Attributes", Computer Vision (ICCV), 2011 IEEE International Conference on, IEEE, pp. 503-510.
Reynolds, Craig W. "Steering Behaviors for Autonomous Characters", Game developers conference, pp. 763-782.

(56) References Cited

OTHER PUBLICATIONS

Ribeiro et al., "The Illusion of Robotic Life", principles and practices of animation for robots. Human-Robot Interaction (HRI), 2012 7th ACM/IEEE International Conference on, IEEE, Mar. 5-8, 2012, pp. 383-390.

Saerbeck et al., "Perception of Affect Elicited by Robot Motion", Human-Robot Interaction (HRI), 2010 5th ACM/IEEE International Conference on, IEEE, 2010, pp. 53-60.

Serrano et al., An intuitive control space for material appearance, ACM Trans. Graph., vol. 35, No. 6, Article 186, Nov. 2016, 12 pages.

Shapiro et al., "Style Components", Proceedings of Graphics Interface 2006, Canadian Information Processing Society, pp. 33-39.

Slyper et al., "Mirror Puppeteering: Animating Toy Robots in Front of a Webcam", Proceedings of the Ninth International Conference on Tangible, Embedded, and Embodied Interaction, ACM, 2015, pp. 241-248.

Sun, Yuyin, "Toward Never-Ending Object Learning for Robots" PhD Thesis, University of Washington, 2016, 191 pages.

Szafir et al., "Communication of intent in assistive free flyers", Proceedings of the 2014 ACM/IEEE international conference on Human-robot interaction, ACM, 2014, pp. 358-365.

Takayama et al., "Expressing Thought: Improving Robot Readability with Animation Principles", Human-Robot Interaction (HRI), 2011 6th ACM/IEEE International Conference on, IEEE, pp. 69-76.

Tan et al., "Happy Moves, Sad Grooves: Using Theories of Biological Motion and Affect to Design Shape-Changing Interfaces", Proceedings of the 2016 ACM Conference on Designing Interactive Systems, ACM, Jun. 4-8, 2016, pp. 1282-1293.

Venture et al., "Recognizing Emotions Conveyed by Human Gait", International Journal of Social Robotics vol. 6, No. 4: 2014, pp. 621-632.

Wächter et al., "On the implementation of an interior-point filter line-search algorithm for large-scale nonlinear programming", Mathematical programming vol. 106, No. 1: 2006, pp. 25-57.

Wang et al., "The cartoon animation filter", ACM Transactions on Graphics (TOG) vol. 25, No. 3: 2006, pp. 1169-1173.

Yuen et al., "A survey of crowdsourcing systems", Privacy, Security, Risk and Trust (PASSAT) and 2011 IEEE Third Inernational Conference on Social Computing (SocialCom), 2011 IEEE Third International Conference on, IEEE, pp. 766-773.

Yumer et al., "Semantic Shape Editing Using Deformation Handles", ACM Transactions on Graphics, vol. 34, No. 4, Article 86, Aug. 2015, 12 pages.

Zhou et al., "Expressive robot motion timing", Proceedings of the 2017 ACM/IEEE International Conference on Human-Robot Interaction, ACM, pp. 22-31.

Maya | Computer Animation & Modeling Software | Autodesk. Retrieved Apr. 4, 2018 from https://www.autodesk.ca/en/products/maya/overview. Retrieved Mar. 12, 2020, 8 pages.

ROS.org | Powering the world's robots. Retrieved Apr. 4, 2018 from http://www.ros.org/, Retrieved on Mar. 12, 2020, 2 pages.

Today in Disney History: Lucky the Dinosaur Walks on the Scene | Disney Parks Blog. Aug. 28, 2013 from https://disneyparks.disney.go.com/blog/2013/08/today-in-disney-history-lucky-the-dinosaur-walks-on-the-scene/, Retrieved on Mar. 12, 2020, 6 pages.

Aibo. aibo. Retrieved Apr. 1, 2018 from http://aibo.com/, Retrieved on Mar. 12, 2020, 9 pages.

KUKA Robotics. Retrieved Apr. 1, 2018 from https://www.kuka.com/en-ca, Retrieved on Mar. 12, 2020, 5 pages.

Ziyu Wang et al., "Robust Imitation of Diverse Behaviors", 31st Conference on Neural Information Processing Systems, 2017, 10 pages.

Non-Final Office Action received for U.S. Appl. No. 16/134,863 dated Feb. 2, 2021, 35 pages.

Non-Final Office Action received for U.S. Appl. No. 16/134,859, dated Oct. 15, 2021, 43 pages.

Final Office Action received for U.S. Appl. No. 16/134,863 dated Jun. 11, 2021, 18 pages.

Final Office Action received for U.S. Appl. No. 16/134,859 dated Feb. 17, 2022, 19 pages.

Kubota et al., "Evolving Pet Robot with Emotional Model", In Proceedings of the 2000 Congress on Evolutionary Computation, vol. 2, 2000, pp. 1231-1237.

Non Final Office Action received for U.S. Appl. No. 16/134,863 dated Oct. 22, 2021, 24 pages.

Final Office Action received for U.S. Appl. No. 16/134,863 dated Feb. 15, 2022, 17 pages.

Erez et al., "An integrated system for real-time model predictive control of humanoid robots", 2013 13th IEEE-RAS International Conference on Humanoid Robots (Humanoids), Oct. 15-17, 2013, pp. 292-299.

Notice of Allowance received for U.S. Appl. No. 16/134,863 dated Jun. 2, 2022, 9 pages.

Advisory Action received for U.S. Appl. No. 16/134,863 dated Sep. 9, 2021, 6 pages.

Non Final Office Action received for U.S. Appl. No. 16/134,859 dated Oct. 27, 2022, 15 pages.

\* cited by examiner

GENERATIVE DESIGN TECHNIQUES FOR ROBOT BEHAVIOR

CROSS-REFERENCE TO RELATED APPLICATIONS

This application claims the priority benefit of the United States provisional patent application titled, "Generative Design Techniques for Robotic Behavior," filed on Jul. 27, 2018 and having Ser. No. 62/711,436. The subject matter of this related application is hereby incorporated herein by reference.

BACKGROUND

Field of the Various Embodiments

Embodiments of the present invention relate generally to robot design and, more specifically, to generative design techniques for robot behavior.

Description of the Related Art

A conventional robot design process typically involves a high-level design phase that is performed by a designer followed by a low-level implementation phase that is performed by a programmer. During the high-level design phase, the designer usually uses some form of graphic design tool to generate graphics depicting the robot performing one or more desired behaviors. A given desired behavior could be, for example, the execution of a specific task and/or the expression of a particular emotional state, among others. During the low-level implementation phase, the programmer usually uses some form of robot design library to generate control code for physically causing the robot to perform the desired behaviors. The control code could describe, for example, how various joints of the robot should rotate over time to perform one or more of the desired behaviors.

One drawback of the above robot design process is that both the designer and the programmer need to use specialized tools for generating the graphics and the control code, respectively. These specialized tools are unusually complex and therefore can be used effectively only by persons who have quite a bit of past experience and training with those specialized tools. Consequently, non-specialists who lack such experience and training are ill equipped to design robots using conventional techniques.

Another drawback is that at least two different people are typically needed to perform the two phases of the robot design process described above because one person rarely has enough experience and training in both graphic design and programming to perform both phases competently. More particularly, designers usually lack the requisite experience to generate control code, while programmers usually lack the requisite experience to generate graphics. Consequently, even when a person has relevant experience in one discipline, that person typically lacks experience in the other discipline, thereby necessitating another person with complementary experience. Having multiple persons involved in the overall design process oftentimes results in delays when designing robot using conventional techniques.

As the foregoing illustrates, what is needed in the art are more effective techniques for designing robots.

SUMMARY

Various embodiments include a computer-implemented method for automatically generating design parameter values when designing a robot, the method comprising generating a first mapping based on a plurality of sets of design parameter values, where the first mapping indicates that a first robot model configured according to a first set of design parameter values performs a first behavior with a first expression level, generating a first behavior slider with which a user interacts to modify an expression level with which the first robot model performs the first behavior, where the first behavior slider indicates different expression levels with which the first robot model performs the first behavior when configured according to different sets of design parameter values, receiving first user input via the first behavior slider indicating that the first robot model should perform the first behavior with a second expression level, and modifying the first set of design parameter values based on the first mapping to generate a second set of design parameter values, where the first robot model performs the first behavior with the second expression level when configured according to the second set of design parameter values.

At least one advantage of the disclosed techniques is that the user need not have specialized skills in either graphic design or programming to generate designs for robots that perform specific behaviors or express various emotions. Accordingly, expressive robots can be designed more efficiently and with less reliance on seasoned experts.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

As noted above, a conventional robot design process typically involves a high-level design phase that is performed by a designer followed by a low-level implementation phase that is performed by a programmer. During the design phase, the designer uses a graphical design tool to generate graphics depicting the robot performing a desired behavior. During the implementation phase, the programmer uses a robot design library to generate control code for physically causing the robot to perform the desired behavior.

However, both the designer and the programmer are required to use specialized tools for generating graphics and code, respectively. These specialized tools are oftentimes too complex to be accessible to non-specialists. In addition, proficiency with one of the needed tools usually does not correlate with proficiency with the other tool because people rarely have sufficient experience with both graphic design and programming. Consequently, the conventional robot design process normally necessitates the participation of multiple specialists, which can extend the length of time needed to generate a robot design.

To address these issues, embodiments of the invention include an automated robot design pipeline that facilitates the design of robots that perform desired behaviors. The disclosed pipeline includes four stages. In the first stage, a generative engine samples a design space to generate a large number of robot designs. In the second stage, a metric engine generates behavioral metrics indicating a degree to which each robot design performs the desired behaviors. In the third stage, a mapping engine generates a behavior predictor that can predict the behavioral metrics for any given robot design. In the fourth stage, a design engine generates a graphical user interface (GUI) that guides the user in performing behavior-driven design of a robot.

At least one advantage of the disclosed approach is that the user need not have specialized skills in either graphic design or programming to generate designs for robots that perform specific behaviors or express various emotions. Accordingly, expressive robots can be designed more efficiently and with less reliance on seasoned experts. Another advantage of the disclosed approach is that a single user can effectively generate a robot design without needing to interoperate with other users. Thus, the overall process for generating a robot design can be expedited compared to conventional robot design processes that involve multiple participants. For these reasons, the disclosed approach confers multiple technical advancements compared to prior art approaches.

System Overview

Figure 1:
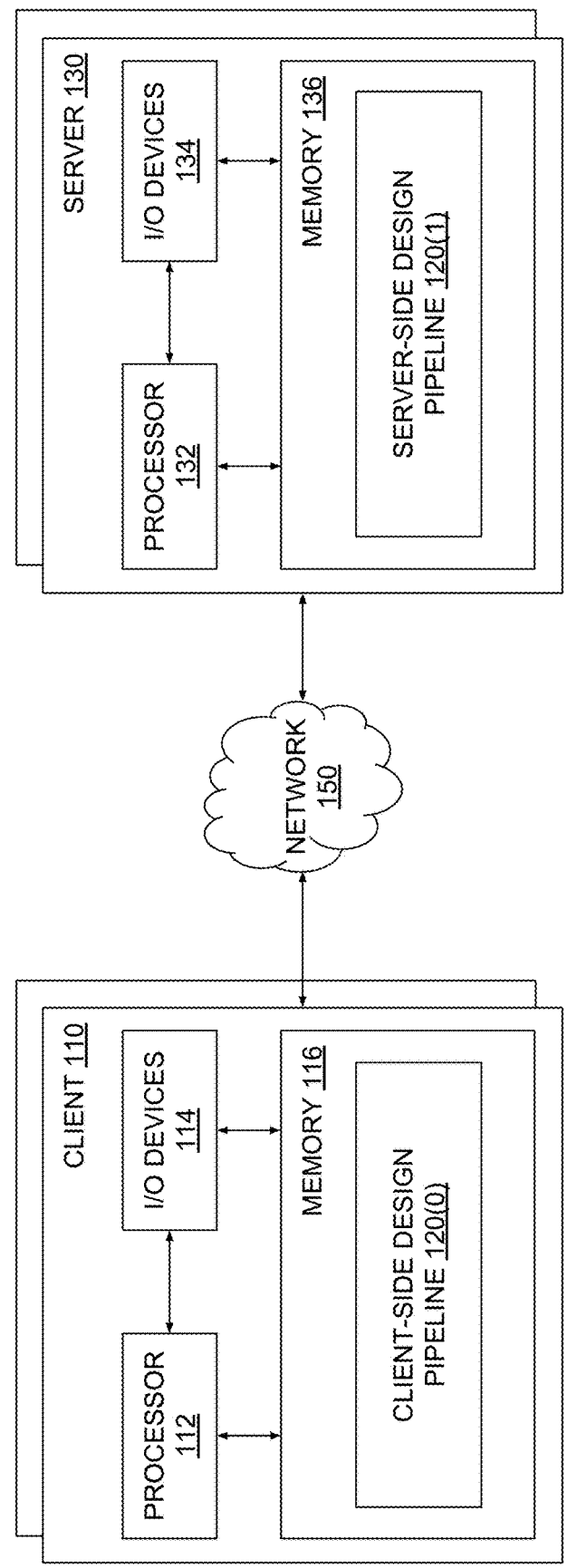
FIG. 1 illustrates a system configured to implement one or more aspects of the present invention.

FIG. 1 illustrates a system configured to implement one or more aspects of the present invention. As shown, system 100 includes one or more clients 110 coupled to one or more servers 130 via a network 150. A given client 110 or a given server 130 may be any technically feasible type of computer system, including a desktop computer, a laptop computer, a mobile device, a virtualized instance of a computing device, a distributed and/or cloud-based computer system, and so forth. Network 150 may be any technically feasible set of interconnected communication links, including a local area network (LAN), wide area network (WAN), the World Wide Web, or the Internet, among others.

As further shown, a client 110 includes a processor 112, input/output (I/O) devices 114, and a memory 116, coupled together. Processor 112 includes any technically feasible set of hardware units configured to process data and execute software applications. For example, processor 112 could include one or more central processing units (CPUs). I/O devices 114 include any technically feasible set of devices configured to perform input and/or output operations, including, for example, a display device, a keyboard, and a touchscreen, among others.

Memory 116 includes any technically feasible storage media configured to store data and software applications, such as, for example, a hard disk, a random-access memory (RAM) module, and a read-only memory (ROM). Memory 116 includes client-side design pipeline 120(0). Client-side design pipeline 120(0) is a software application that, when executed by processor 112, causes processor 112 to participate in generating designs for robots. In doing so, client-side design pipeline 120(0) interoperates with a corresponding client-side design pipeline 120(1) that resides within server 130, as described in greater detail below.

Server 130 includes a processor 132, I/O devices 134, and a memory 136, coupled together. Processor 132 includes any technically feasible set of hardware units configured to process data and execute software applications, such as one or more CPUs. I/O devices 134 include any technically feasible set of devices configured to perform input and/or output operations, such as a display device, a keyboard, or a touchscreen, among others.

Memory 136 includes any technically feasible storage media configured to store data and software applications, such as, for example, a hard disk, a RAM module, and a ROM. Memory 136 includes server-side design pipeline 120(1). Server-side design pipeline 120(1) is a software application that, when executed by processor 132, causes processor 132 to participate in generating designs for robots. In so doing, server-side design pipeline 120(1) interoperates with client-side design pipeline 120(0), as mentioned above.

In operation, one or more instances of client-side design pipeline 120(0) and one or more instances of server-side design pipeline 120(1) interoperate to generate designs for robots. As a general matter, one or more client-side pipelines 120(0) and one or more server-side pipelines 120(1) collectively represent different portions of a distributed software entity. Thus, for simplicity, client-side design pipeline 120 (0) and server-side design pipeline 120(1) will be collectively referred to herein as design pipeline 120. Design pipeline 120 is described in greater detail below in conjunction with FIG. 2.

Figure 2:
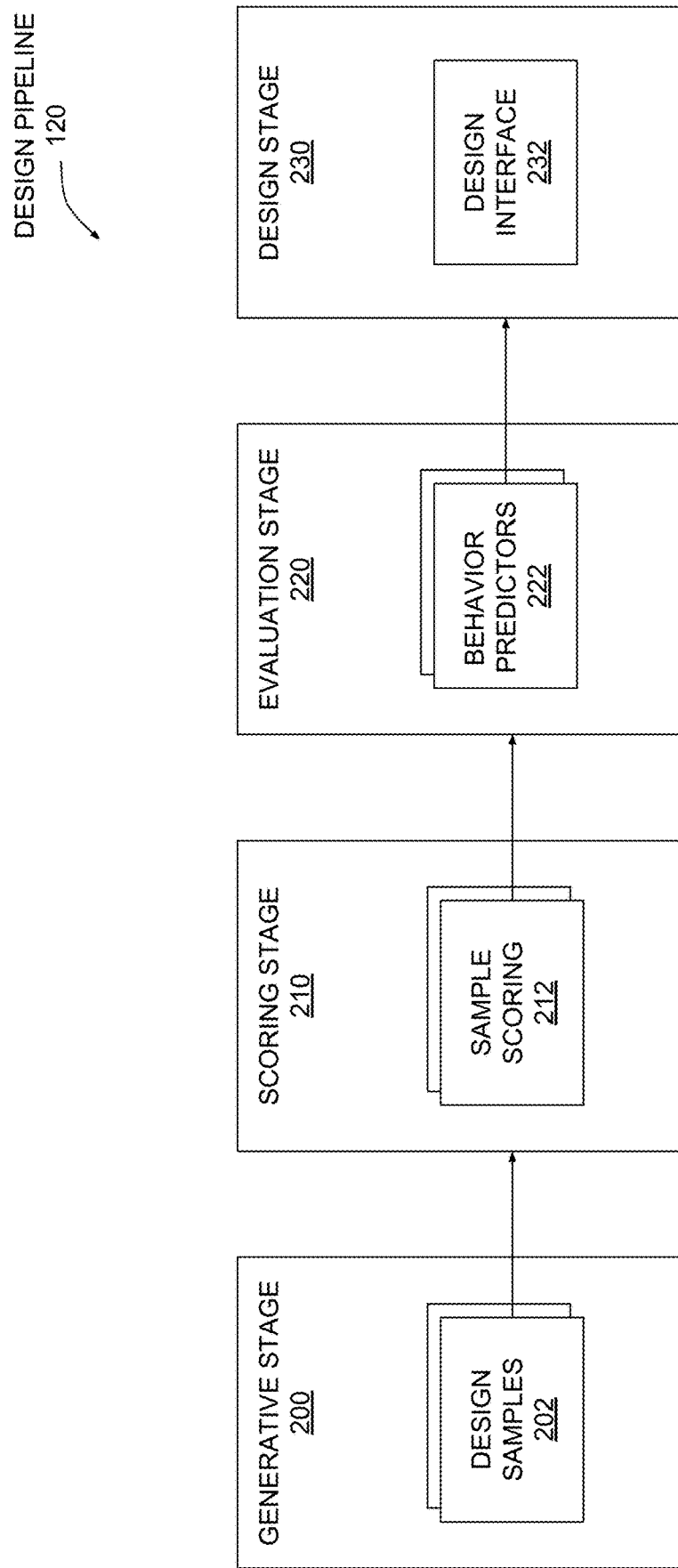
FIG. 2 is a more detailed illustration of the design pipeline of FIG. 1, according to various embodiments of the present invention.

FIG. 2 is a more detailed illustration of the design pipeline of FIG. 1, according to various embodiments of the present invention. As shown, design pipeline 120 includes a generative stage 200, a scoring stage 210, an evaluation stage 220, and a design stage 230. The first three stages of design pipeline 120 generate various data that is subsequently used in the final stage of design pipeline 120 to assist a user with generating designs for robots.

Generative stage 200 produces design samples 202 via a generative design process. Design samples 202 include many different designs for a particular type of robot. A given design generally includes a model of a particular type of robot configured according to specific parameters. Generative stage 202 produces design samples 202 by sampling a design space that includes different combinations of these parameters. Each design sample 202 also includes an animated clip rendered to depict the dynamics of the associated design. Generative stage 202 is described in greater detail below in conjunction with FIGS. 4-6.

Scoring stage 210 analyzes design samples 202 to determine the degree to which each design sample 202 performs one or more behaviors. A given behavior could include, for example, the expression of a particular emotional state, such as happiness, sadness, or anger, among others. A given behavior could also include, for example, the execution of a specific action, such as hopping, slouching, or limping, among others. For a given design sample 202, scoring stage 210 analyzes the unique set of parameters associated with the given design sample 202 and/or the animated clip depicting the dynamics of the associated design. Based on this analysis, scoring stage 210 generates one or more metrics indicating the degree to which the one or more behaviors are performed. Scoring stage 210 is described in greater detail below in conjunction with FIGS. 7-9.

Evaluation stage 220 analyzes sample scoring 212 to determine how variations in design samples 202 influence the behavioral metrics associated with the one or more behaviors. In particular, for a given behavior, evaluation stage 220 generates a behavior predictor 222 that can predict the behavioral metrics for a given design sample 202 based on the parameters included in that design sample 202. Evaluation stage 220 generates behavior predictors 222 for each behavior by iteratively adjusting a mapping between different sets of parameters and corresponding behavioral metrics until a convergence criterion is met. Evaluation stage 220 is described in greater detail below in conjunction with FIGS. 10-12.

Design stage 230 processes any and all data generated by the previous three stages of design pipeline 120 and generates a design interface 232. Design interface 232 is a graphical user interface (GUI) with which a user can interact to generate a design for a robot. Design interface 232 includes various GUI elements that guide the user in designing a robot to perform one or more desired behaviors. Design interface 232 uses behavior predictors 222 to predict the effects of the user changing various parameters associated with a given design. Design interface 232 provides feedback to the user via the various GUI elements indicating those predicted effects. Design interface 232 can also use behavior predictors 222 to automatically adjust the parameters associated with the given design to increase or decrease the degree to which a certain behavior is performed. Design stage is described in greater detail below in conjunction with FIGS. 13-15C.

Advantageously, design pipeline 120 greatly simplifies the process of designing robots to perform specific behaviors and express desired emotions. Importantly, user of design pipeline 120 need not have specialized experience with graphic design tools or robot control libraries in order to produce expressive robot designs. The user is thus enabled to produce these designs without needing to interoperate with others. Accordingly, design pipeline 120 represents a significant improvement over a conventional design process that requires both specialized knowledge and multiple specialists. Various operations performed via the four stages of design pipeline 120 are described in greater detail below in conjunction with FIG. 3.

Figure 3:
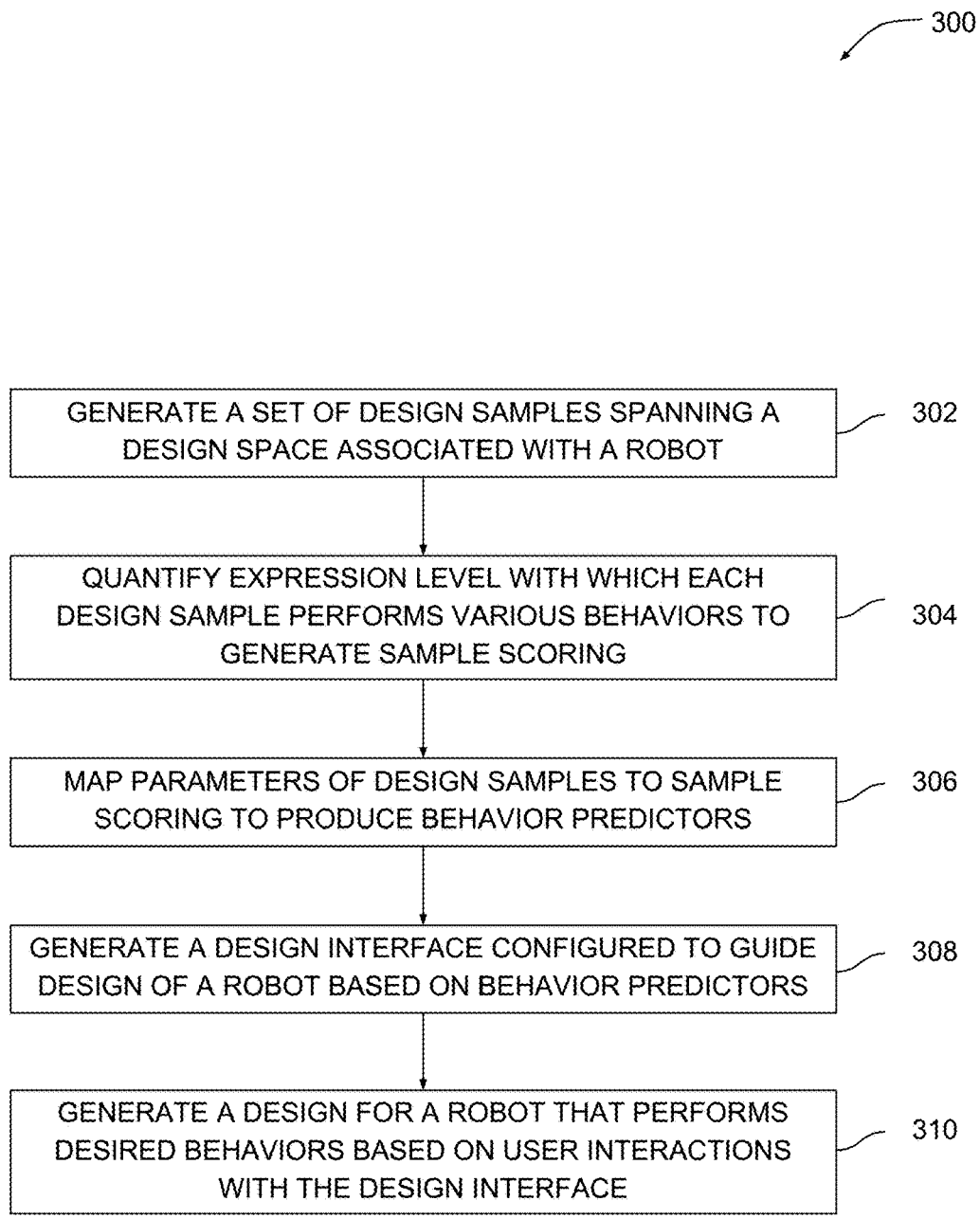
FIG. 3 is a flow diagram of method steps for designing a robot that performs one or more desired behaviors, according to various embodiments of the present invention.

FIG. 3 is a flow diagram of method steps for designing a robot that performs one or more desired behaviors, according to various embodiments of the present invention. Although the method steps are described in conjunction with the systems of FIGS. 1-4, persons skilled in the art will understand that any system configured to perform the method steps in any order falls within the scope of the present invention.

Figure 4:
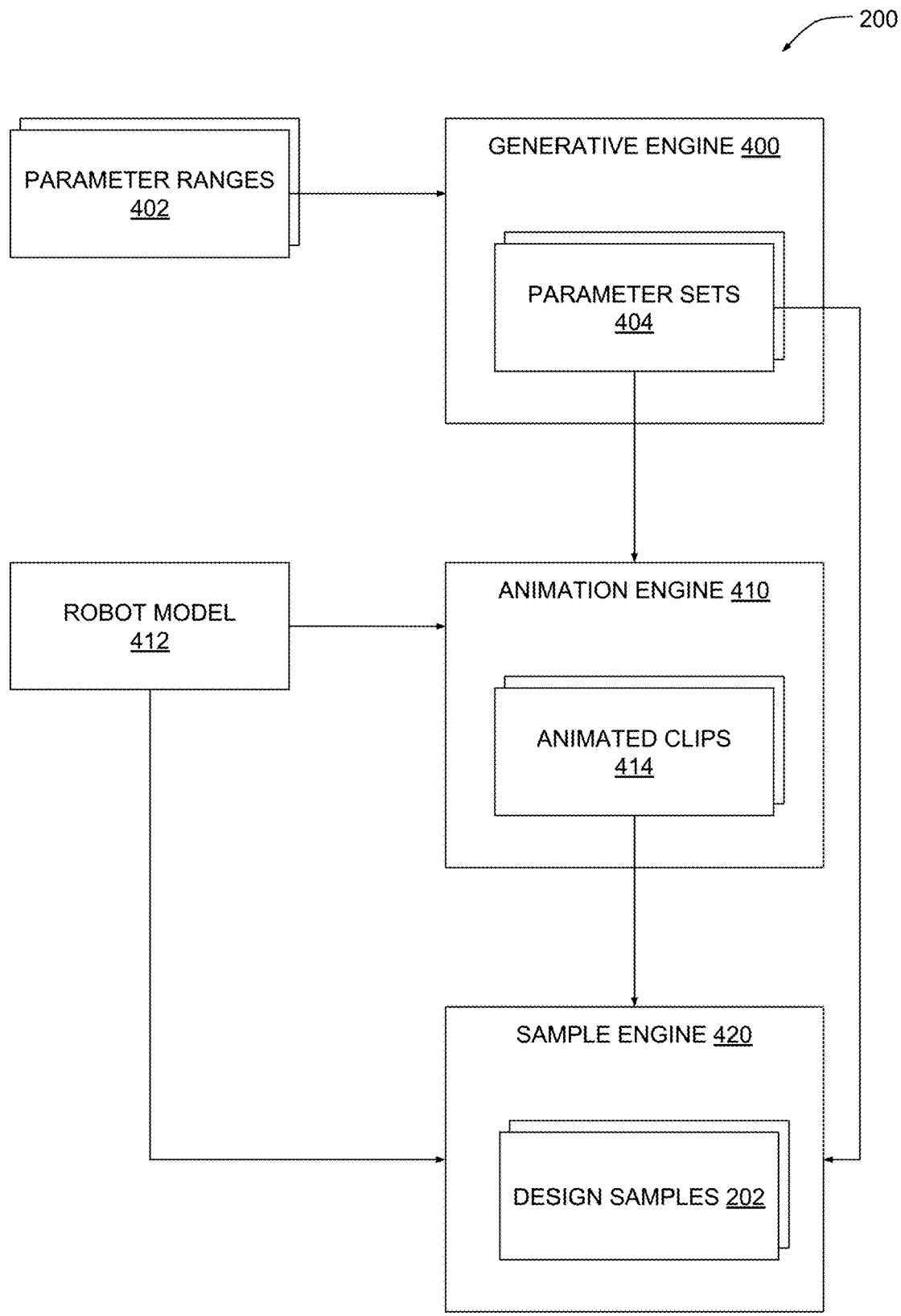
FIG. 4 is a more detailed illustration of the generative stage of FIG. 2, according to various embodiments of the present invention.

As shown, a method 300 begins at step 302, where generative stage 200 generates a set of design samples 202 spanning a design space associated with a robot. The design space includes many different combinations of parameters associated with a model of the robot. A given design sample 202 includes a unique set of parameters that describe dynamics for the robot as well as an animated clip rendered to depict the robot operating according to those dynamics. Because generative stage 200 produces numerous design samples 202, these design samples potentially perform a wide variety of different identifiable behaviors and/or express many different possible emotional states. Various engines configured to implement generative stage 200 and perform step 302 are illustrated in FIG. 4.

Figure 7:
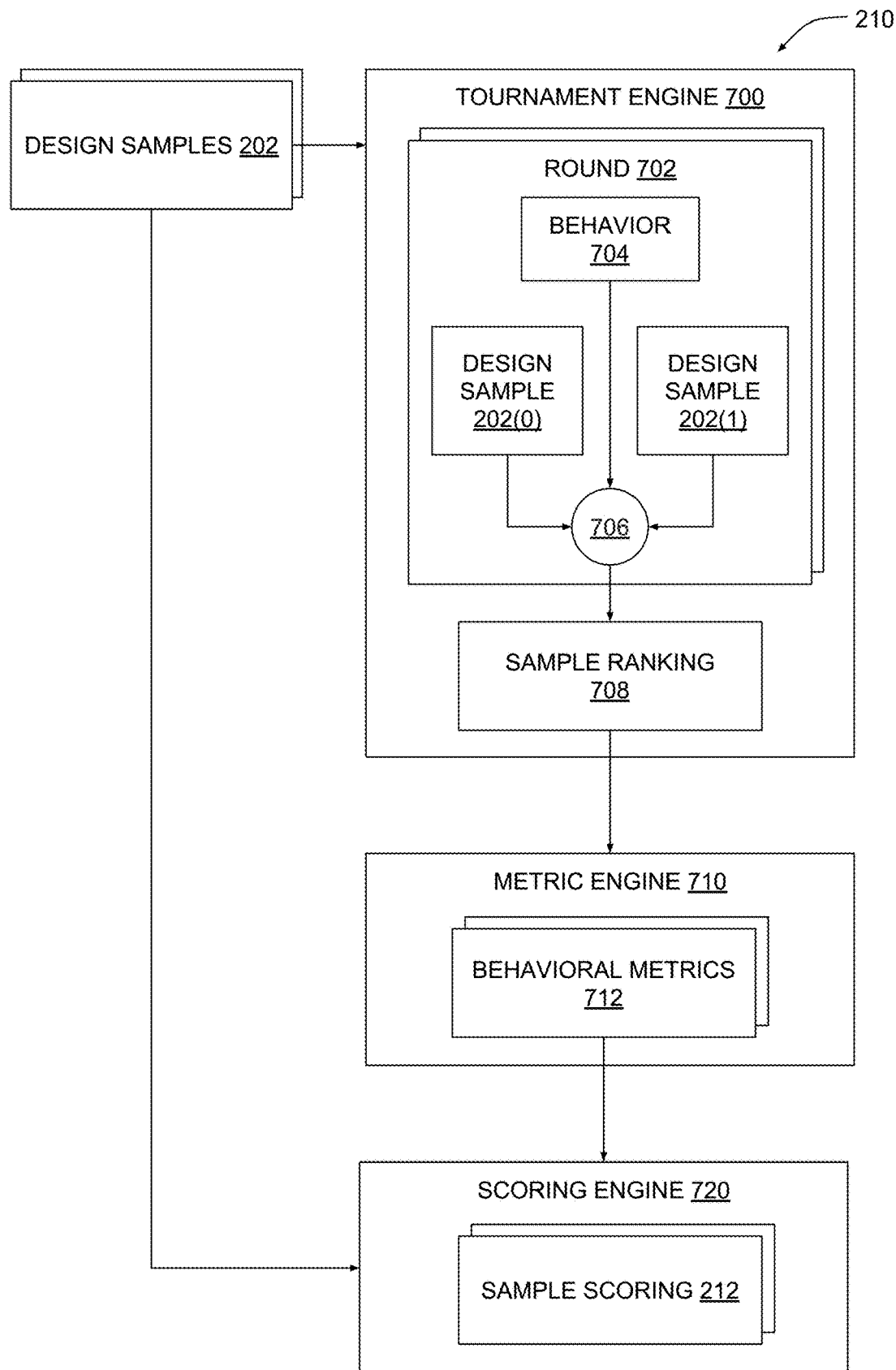
FIG. 7 is a more detailed illustration of the scoring stage of FIG. 2, according to various embodiments of the present invention.

At step 304, scoring stage 210 quantifies an expression level with which each design sample 202 performs one or more behaviors to generate sample scoring 212. For a given design sample 202, scoring stage 210 evaluates the design sample 202 to determine the degree to which the design sample 202 performs a given behavior. In one embodiment, scoring stage 210 may compare each design sample 202 to one or more other design samples 202 to identify which design sample performs the behavior to a greater degree. Various engines configured to implement scoring stage 210 and perform step 304 are illustrated in FIG. 7.

Figure 10:
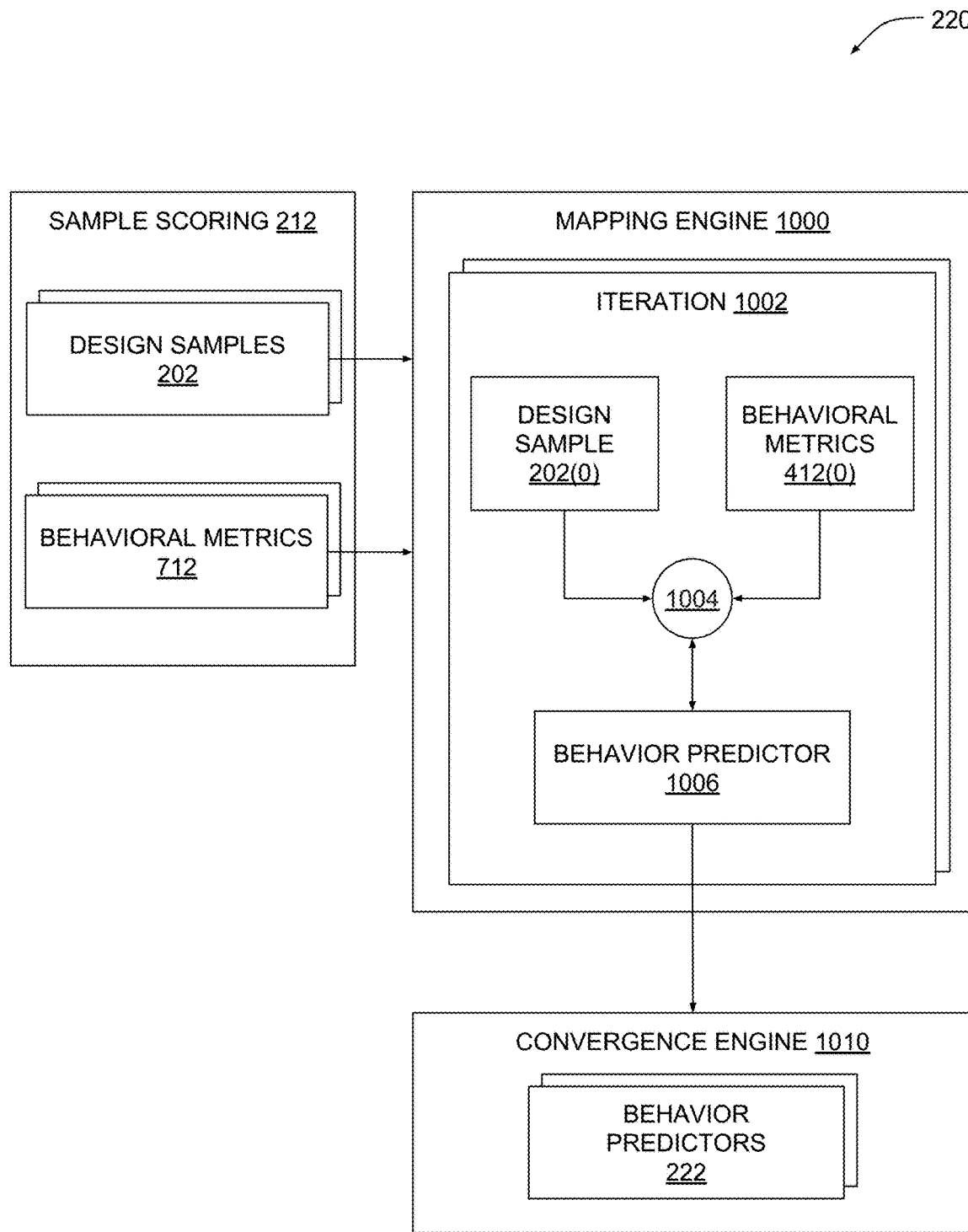
FIG. 10 is a more detailed illustration of the evaluation stage of FIG. 2, according to various embodiments of the present invention.

At step 306, evaluation stage 220 maps the sets of parameters included in design samples 202 to sample scoring 212 to produce behavior predictors 222. A given behavior predictor 222 can predict the degree to which a specific behavior is performed by a particular design based on the set of parameters associated with the design. Behavior predictors 222 can be generated, for example, by executing a regression operation to iteratively update a mapping between sets of parameters and behavioral metrics associated with design samples 202. Various engines configured to implement evaluation stage 220 and perform step 306 are illustrated in FIG. 10.

At step 308, design stage 230 generates design interface 232 to guide the design of a robot based on behavior predictors 222. Design interface 232 operates in a parameter editing mode or a semantic editing mode when generating a design for a robot. When operating in the parameter editing mode, design interface 232 uses behavior predictors 222 to generate visual indications of the effects of modifying each parameter of the design. When operating in the semantic editing mode, design interface 232 uses behavior predictors to automatically modify the parameters of the design in response to the user selecting a desired behavior.

Figure 13:
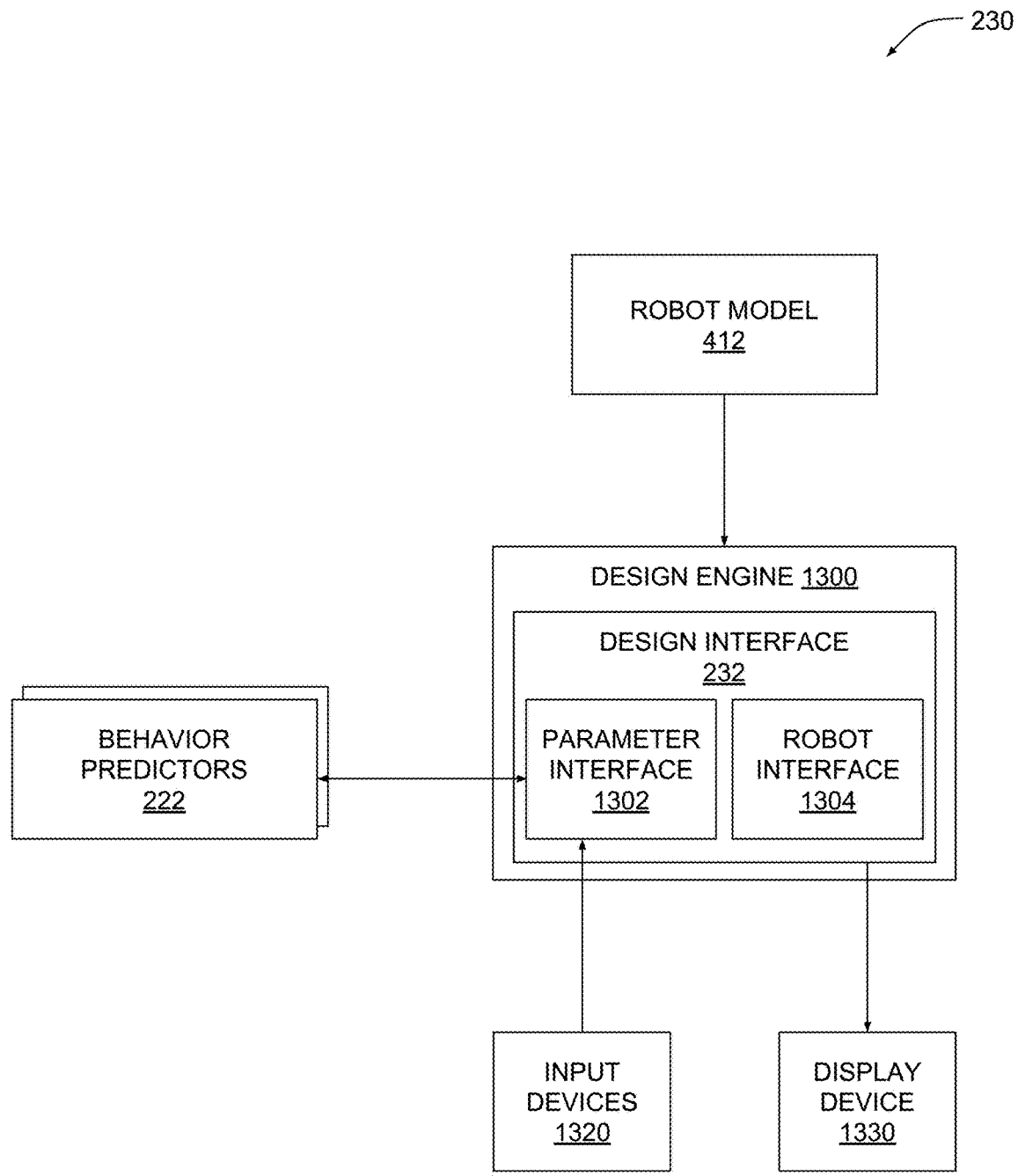
FIG. 13 is a more detailed illustration of the design stage of FIG. 2, according to various embodiments of the present invention.

At step 310, design stage 230 generates a design for a robot that performs desired behaviors based on user interactions with design interface 232. Design stage 230 can generate the design based on user interactions when design interface 232 operates in parameter editing mode, semantic editing mode, or both. At any point during the design process, design stage 230 can generate and render animated clips depicting dynamics associated with the current design. Accordingly, the user can evaluate the design to determine whether the expression level of any behaviors should be increased or decreased. Various engines configured to implement design stage 230 and perform steps 306 and 308 are illustrated in FIG. 13.

Referring generally to FIGS. 1-3, the various stages of design pipeline 120 and/or steps of the method 300 can be distributed across the various computing devices shown in FIG. 1 in any technically feasible fashion. In one embodiment, server 130 executes generative stage 200, one or more clients 110 execute scoring stage 210, server 130 then executes evaluation stage 220, and one or more clients 110 then execute design stage 230. Persons skilled in the art will recognize other ways the various stages can be distributed across the computing resources of system 100.

Generative Stage

FIG. 4 is a more detailed illustration of the generative stage of FIG. 2, according to various embodiments of the present invention. As shown, generative stage 200 includes a generative engine 400, an animation engine 410, and a sample engine 420, coupled together in a pipelined fashion.

Figure 5A:
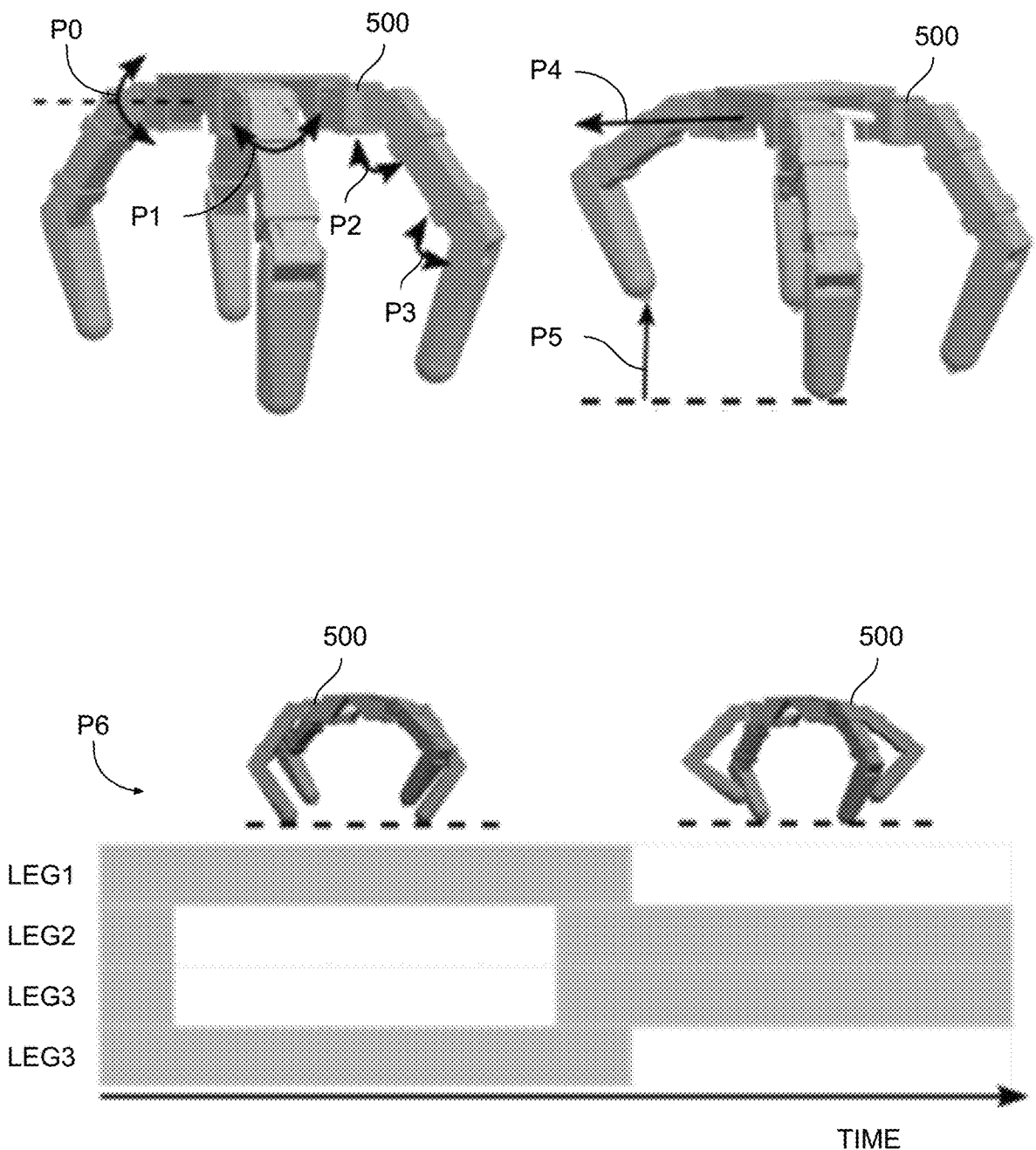
FIGS. 5A-5C illustrate exemplary design sample data generated via the generative stage of FIG. 4, according to various embodiments of the present invention.

In operation, generative engine 400 processes parameter ranges 402 to generate parameter sets 404. Parameter ranges 402 include maximum and minimum values for different parameters associated with a model of the specific type of robot being designed. Generative engine 400 discretizes the range of each parameter to generate a set of values and then samples those values to produce parameter sets 404. A given parameter set 404 includes a unique combination of parameter values sampled from the discretized version of parameter ranges 402. Accordingly, parameter sets 404 collectively represent a design space where each position in the design space corresponds to a different design for a robot. FIG. 5A illustrates an example of various parameters associated with a model of a quadruped robot.

Referring now to FIG. 5A, as shown, a simulated robot 500 is defined based on different parameter values. In this example, simulated robot 500 is a quadruped robot. A given parameter value influences a different aspect of the dynamic behavior of simulated robot 500 during a physical simulation. Parameter P0 controls the pose or body angle of simulated robot 500. Parameter P1 controls the front hip angle of simulated robot 500. Parameter P2 controls the rear knee angle of simulated robot 500. Parameter P3 controls the rear ankle angle of simulated robot 500. Parameter P4 controls the walking speed of simulated robot 400. Parameter P5 controls the foot height of simulated robot 500 during walking. Parameter P6 controls the gait pattern of simulated robot 500. Parameter P6 includes a different sub-parameter for each of the four legs of simulated robot 500 indicating whether the respective leg is lifted or planted at different times. For example, in the exemplary gait pattern shown, these sub-parameters indicate that legs 1 and 4 are initially planted while legs 2 and 3 are initially lifted.

Figure 5B:
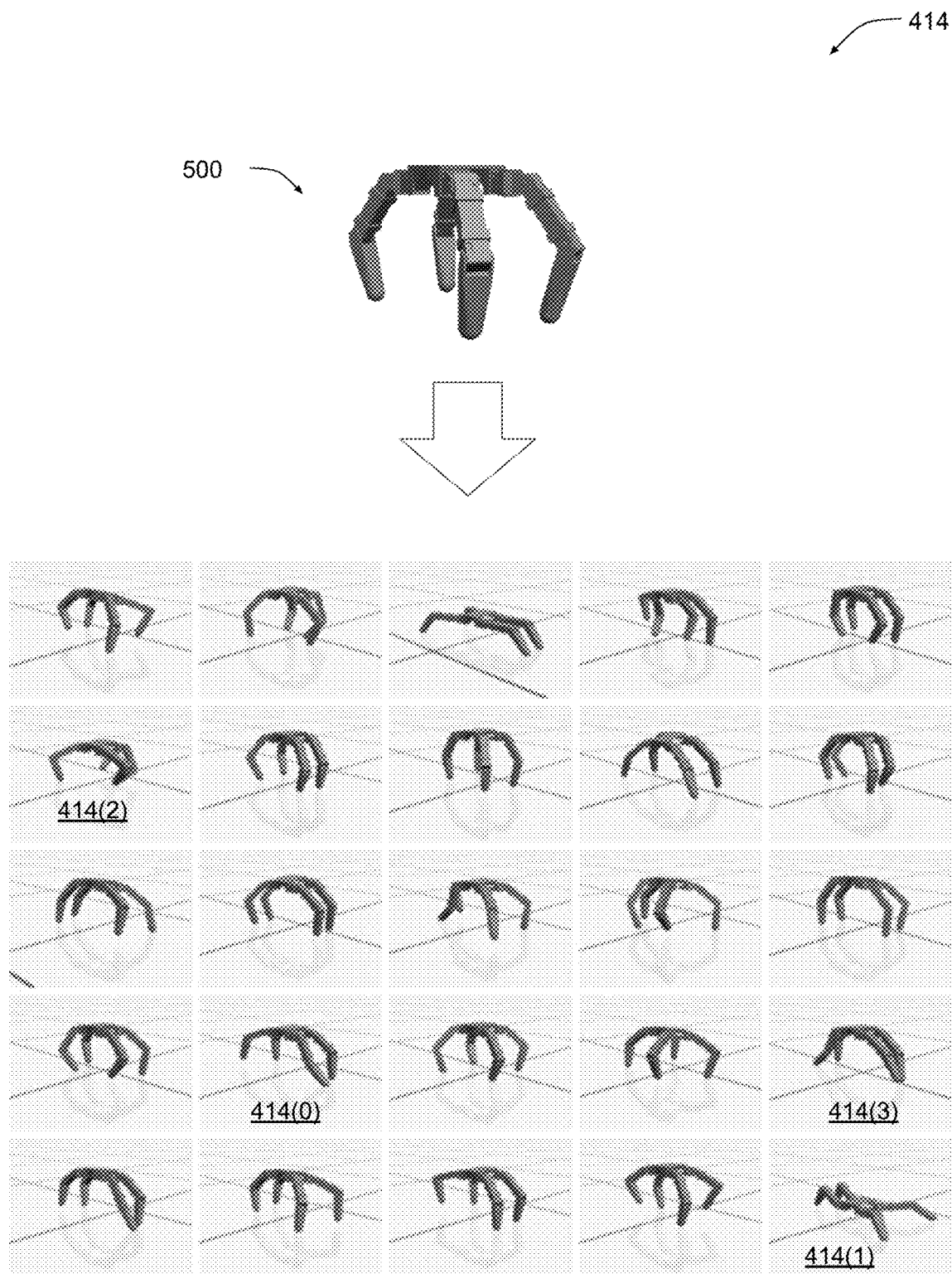

Referring back now to FIG. 4, generative engine 400 generates parameter sets 404 in the manner described and then transmits these parameter sets to animation engine 410 for rendering. Animation engine 410 processes parameter sets 404 and robot model 412 to generate animated clips 414. Robot model 412 describes joint and limb connectivity information and associated kinematic properties related to the type of robot being designed. Animation engine 410 processes robot model 412 with each of the different parameter sets 404 to produce a large number of animated clips 414. Because each parameter set 404 includes a different combination of parameter values, each animated clip 414 depicts a simulated robot operating with unique dynamic properties. In some cases, the simulated robot may appear to perform a specific behavior, such as the execution of a given action or the expression of a given emotional state. FIG. 5B illustrates an example of animated clips 414.

Referring now to FIG. 5B, as shown, animated clips 414 are rendered based on simulated robot 500 shown in FIG. 5A. During the rendering process, animation engine 410 simulates the dynamics of simulated robot 500 with different parameter settings derived from parameter sets 404, thereby producing a different animated clip for each different parameter set 404. Thus, animated clips 414 collectively provide a visualization of the design space defined by parameter sets 404.

Certain animated clips 414 depict different versions of simulated robot 500 executing identifiable actions. For example, animated clip 414(0) could depict simulated robot 500 limping, as one leg of simulated robot 500 appears to drag. Likewise, animated clip 414(1) could depict simulated robot 500 sneaking along the ground, since the pose of simulated model 500 appears flattened. Other animated clips 414 depict different versions of simulated robot 500 expressing identifiable emotional states. For example, animated clip 414(2) could depict simulated robot 500 expressing an angry state, because simulated robot 500 appears to be stalking head-down towards the viewer. Animated clip 414(3), on the other hand, could depict simulated robot 500 expressing the state of sadness, as simulated robot 500 appears to mope.

Referring back now to FIG. 4, animation engine 410 generates animated clips 414 in the manner described and then transmits animated clips 414 to sample engine 420 to be incorporated into design samples 202. Sample engine 420 obtains parameter sets 404, robot model 412, and animated clips 414 and then collates this data to create the plurality of design samples 202 shown in FIG. 2. An exemplary design sample 202 is shown in FIG. 5C.

Figure 5C:
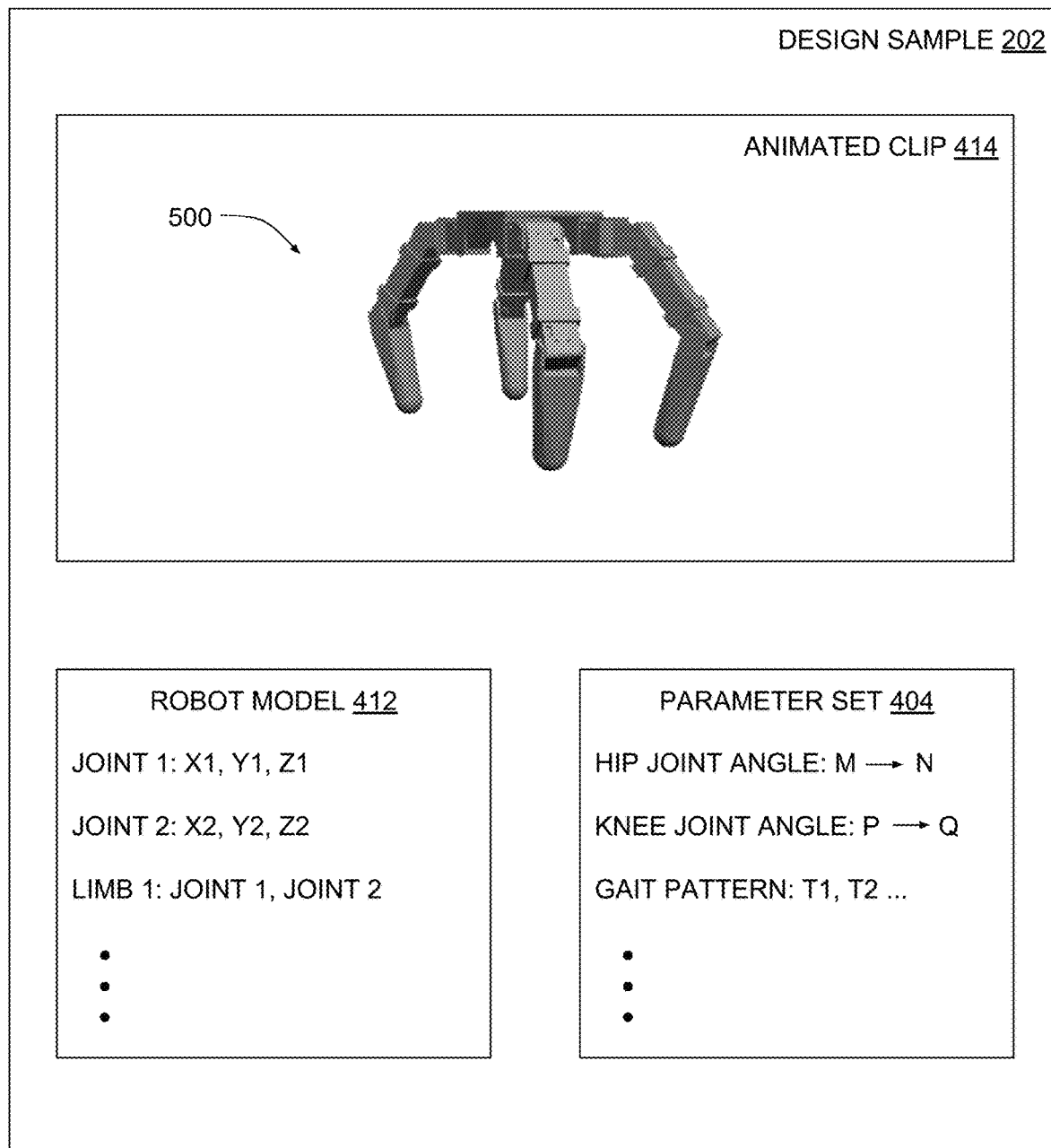

Referring now to FIG. 5C, as shown, a design sample 202 includes an animated clip 414, robot model 412, and parameter set 404. Parameter set 404 includes exemplary parameters, such as hip joint angle, knee joint angle, gait pattern, and so forth, as described above in conjunction with FIG. 5A. Robot model 412 indicates specific joints, limbs, and joint-limb connections, as previously discussed. Animated clip 414 depicts simulated robot 500 of FIGS. 5A-5B. Simulated robot 500 is configured with parameter set 404, and therefore may have unique dynamic properties compared to other simulated models configured with other parameter sets.

Via the techniques described in conjunction with FIGS. 6 and 5A-5C, generative stage 200 produces design samples 202 which span a design space associated with a particular type of robot, such as a quadruped robot. The disclosed techniques are equally applicable to other types of robots as well, including robotic arms, among others. The operation of generative stage 200 is described in stepwise fashion below in conjunction with FIG. 6.

Figure 6:
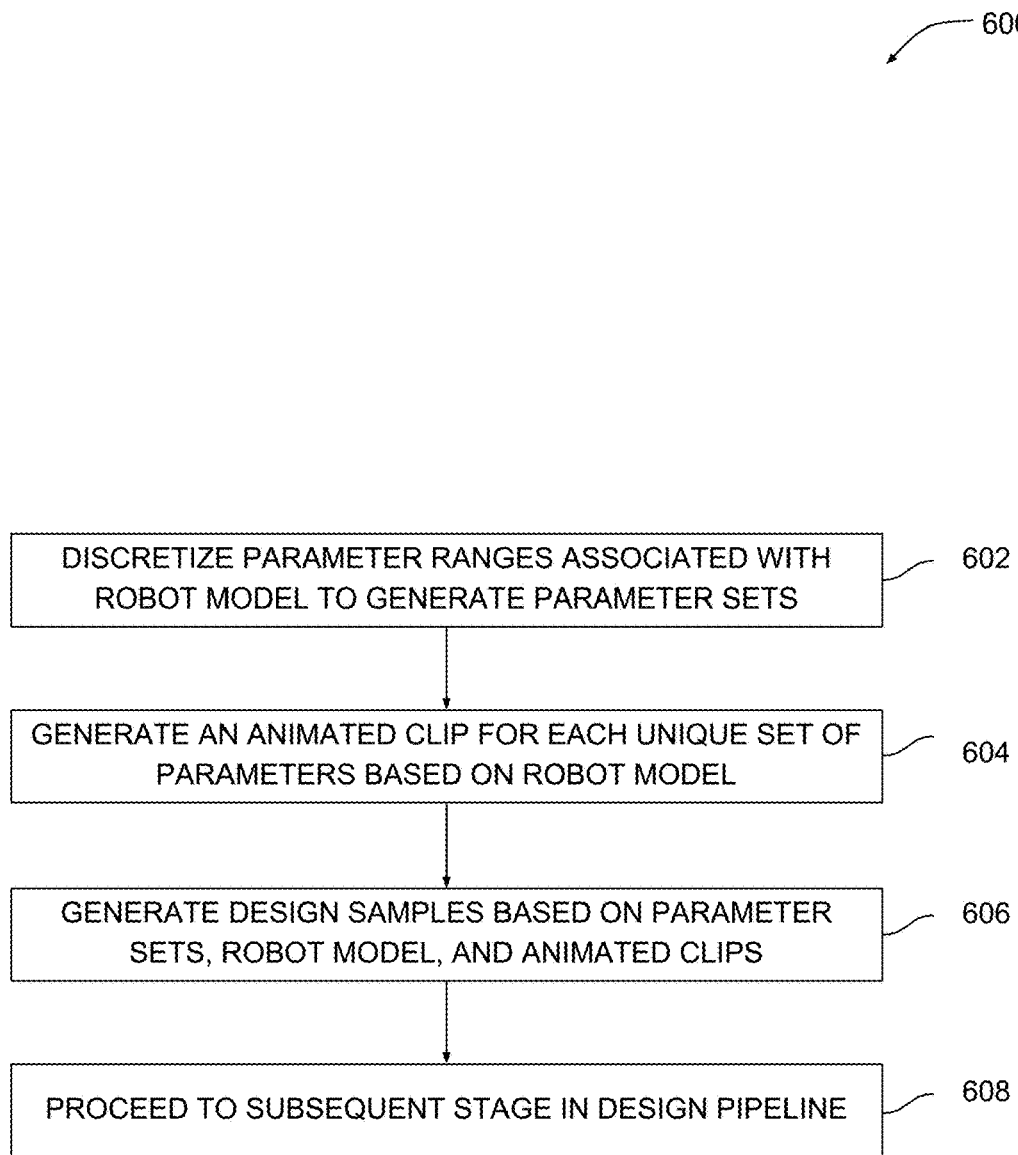
FIG. 6 is a flow diagram of method steps for generating a set of design samples that span the design space for a robot, according to various embodiments of the present invention.

FIG. 6 is a flow diagram of method steps for generating a set of design samples that span the design space for a robot, according to various embodiments of the present invention. Although the method steps are described in conjunction with the systems of FIGS. 1-5, persons skilled in the art will understand that any system configured to perform the method steps in any order falls within the scope of the present invention.

As shown, a method 600 begins at step 602, where generative engine 400 within generative stage 200 discretizes parameter ranges 402 associated with robot model 412 to generate parameter sets 404. Each parameter range 402 includes minimum and maximum values for a given parameter associated with robot model 412. For example, a parameter range associated with a quadruped robot could indicate a maximum and minimum hip joint angle. Generative engine 400 samples a given parameter range by selecting a value or sub-range of values within the range.

At step 604, animation engine 410 within generative stage 200 generates an animated clip 414 for each parameter set 404 based on robot model 412. Animation engine 410 is configured to simulate robot model 412 with each parameter set 404 and render an animated clip of each different configuration of robot model 412. Accordingly, for each parameter set 404, animation engine 410 renders a different animated clip 414. Animated clips 414 thus visually represent the design space defined by parameter sets 404.

At step 606, sample engine 420 within generative stage 200 generates design samples 202 based on parameter sets 404, robot model 412, and animated clips 414. In so doing, sample engine 420 collates each parameter set 404 with the corresponding animated clip 414 along with robot model 412. In some embodiments, robot model 412 may be omitted from design samples 202. In other embodiments, robot model 412 configured according to parameter set 404 is included in design sample 202. At step 608, generative stage 200 is complete and proceeds to the subsequent stage in design pipeline 120; scoring stage 210. Scoring stage 210 is described in greater detail below in conjunction with FIGS. 7-9.

Scoring Stage

FIG. 7 is a more detailed illustration of scoring stage 210 of FIG. 2, according to various embodiments of the present invention. As shown, scoring stage 210 includes a tournament engine 700, a metric engine 710, and a scoring engine 720, coupled together in a pipelined fashion.

In operation, tournament engine 700 processes design samples 202 across a plurality of iterative rounds 702 to generate sample rankings 708. During a given round 702, tournament engine 700 compares two design samples 202(0) and 202(1) to one another and then determines which of the two design samples 202 performs a behavior 704 with a greater level of expression. Again, the behavior could be associated with a specific task or emotional state. A given round 702 may include just one comparison, or multiple comparisons. Tournament engine 700 implements a comparator 706 to analyze various aspects of design samples 202(0) and 202(1) relative to one another to judge the performance of those samples in relation to behavior 704. Comparator 706 determines which of design samples 202(0) and 202(1) best performs behavior 704 or, alternatively, determines that design samples 202(0) and 202(1) equally perform the behavior. Comparator 706 then generates and/or updates sample rankings 708 to indicate how design samples 202(0) and 202(1) fared during comparison relative to behavior 704.

Figure 8A:
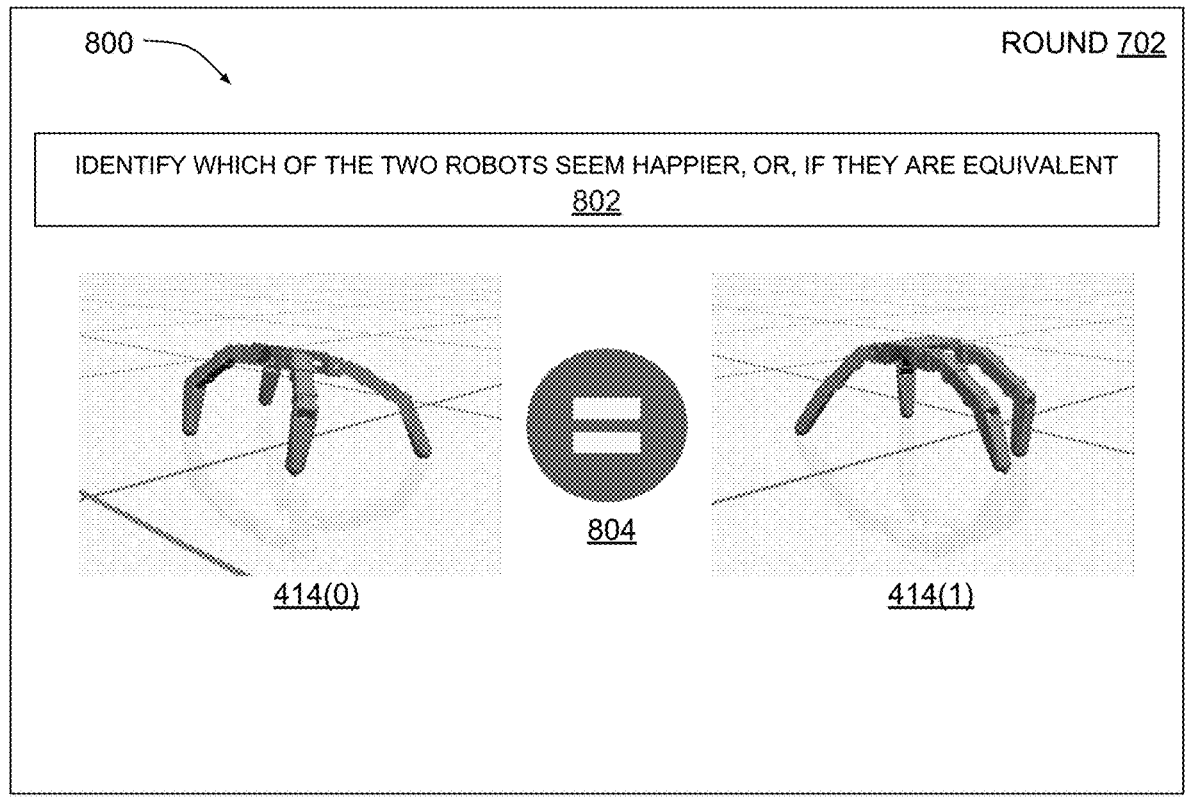
FIGS. 8A-8B illustrate exemplary sample scoring data that is generated via the scoring stage of FIG. 7, according to various embodiments of the present invention.

Tournament engine 700 may implement several different types of comparators 706, according to various different embodiments. In one embodiment, comparator 706 may implement an artificial neural network (ANN) previously trained with a dataset of design samples that are labeled with various behaviors. During a given round 702, the ANN may analyze either or both of an animated clip 414 and a parameter set 404 associated with a given design sample 202 and then output a label corresponding to a particular behavior. When analyzing an animated clip 414, the ANN may implement computer vision techniques and/or machine learning techniques to identify the performance of the behavior. The ANN may further indicate a degree of certainty with which the design sample 202 performs the behavior. The ANN may perform this approach with both design samples 202(0) and 202(1) and then identify which design sample performs behavior 704 with the greatest certainty. In another embodiment, comparator 706 implements a set of expert-coded heuristics to either or both of an animated clip 414 and a parameter set 404 associated with a given design sample 202. One or more heuristics may correspond to a particular behavior. During a given round 702, comparator applies these heuristics to the animated clips 414 and/or parameter sets 404 associated with both design sample 202(0) and 202(1) and then determines the degree to which each design sample performs behavior 704. In yet another embodiment, comparator 706 outsources and/or crowdsources the comparison of design samples 202 to one or more users. FIG. 8A illustrates an example of how comparator 706 implements this latter approach.

Referring now to FIG. 8A, as shown, a comparison UI 800 includes instructions 802, an animated clip 414(0), an animated clip 414(1), and an equivalence indicator 804. Instructions 802 generally ask that the user identify which of the two animated clips 414 depicts a simulated robot that performs the indicated behavior 704 to the greatest degree. In this example, behavior 704 is the expression of happiness. A user can select either of clips 414(0) or 414(1), indicating that the corresponding design sample 202(0) or 202(1), respectively, appears to be happier. A user can also select equivalence indicator 804 to indicate that the simulated robots appear equally happy. This approach can be implemented to obtain feedback from the user of design pipeline 120 and/or to obtain feedback from third party individuals who are not users of design pipeline 120. For example, comparison UI 800 could be deployed via a web portal to a group of individuals contracted to perform manual tasks.

Referring back now to FIG. 7, tournament engine 700 implements one or more sets of rounds, using any of the comparators 706 discussed above, in order to generate and/or update sample rankings 708. In one embodiment, tournament engine 700 implements a first round 702 and then eliminates a subset of design samples 202 that are not determined to perform any behaviors to a significant degree. Comparator 706 could have rarely or never selected these low-performing design samples, for example, and so these design samples 202 could have a low ranking. Tournament engine 700 may then implement any number of additional rounds 702 and eliminate additional design samples 202. This approach can reduce the number of comparisons needed by iteratively removing design samples from competition, thereby shrinking the design space associated with design samples 202.

Figure 8B:
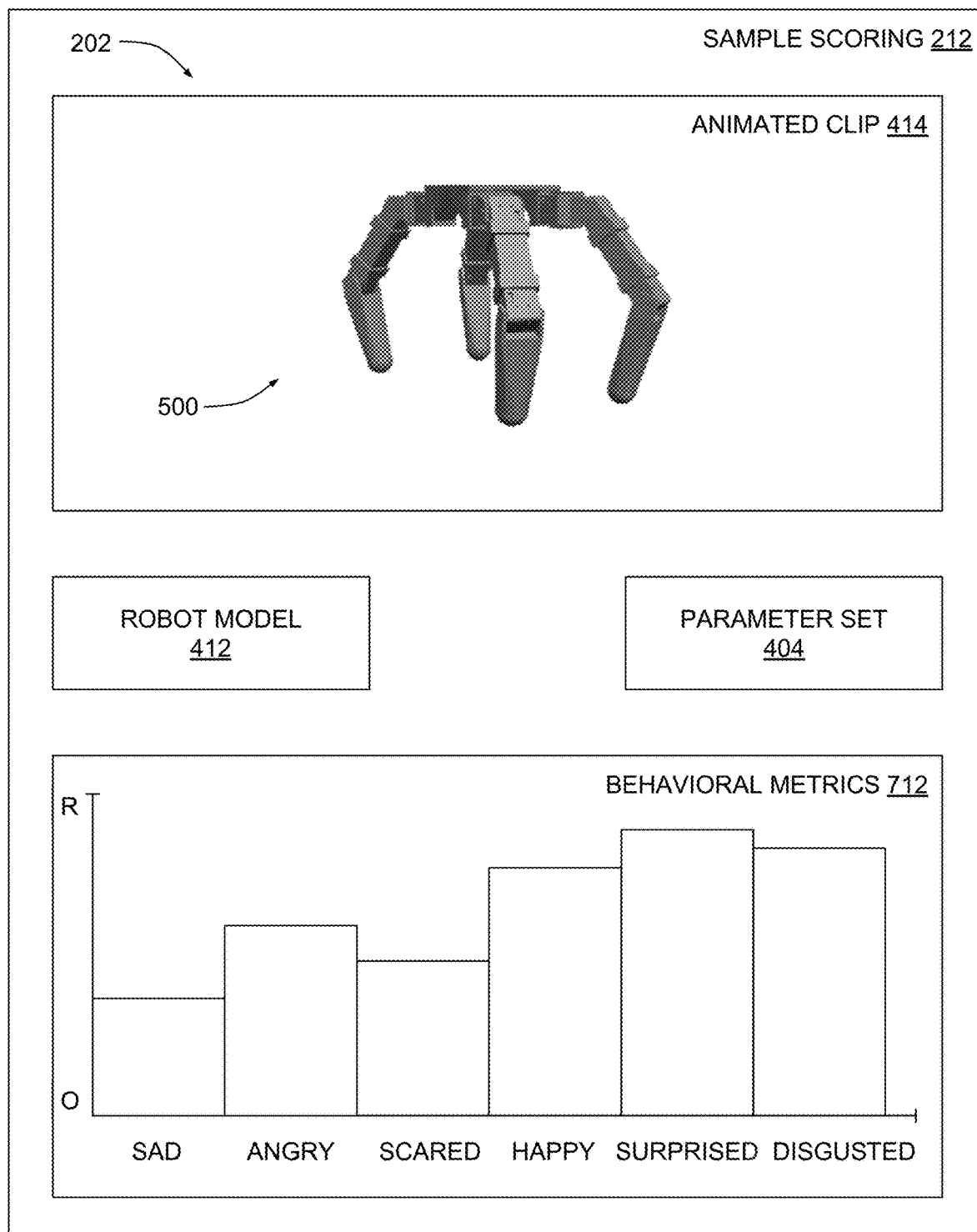

Metric engine 710 obtains sample rankings 708 from tournament engine 700 once all rounds 702 are complete. Sample rankings 708 indicate a different ranking of design samples 202 for each of the one or more behaviors under consideration. Metric engine 710 processes these rankings and then generates behavioral metrics 712 for each design sample 202. The behavioral metrics for a given design sample indicate the degree to which that design sample performs each of the different behaviors, also referred to as an "expression level." Scoring engine 720 obtains behavioral metrics 712 and then collates this data with the design samples 202 to generate sample scoring 212. FIG. 8B illustrates an example of sample scoring 212.

Referring now to FIG. 8B, as shown, sample scoring 212 includes data included in a design sample 202, including an animated clip 414, a robot model 412, and a parameter set 404, as well as behavioral metrics 712 generated in the manner described above. Here, behavioral metrics 712 indicate an expression level between zero and R with which simulated robot 500 expresses different emotional states. Thus, behavioral metrics 712 include quantified representations of the performance of different behaviors.

By performing the approach described in conjunction with FIGS. 7 and 8A-8B, scoring stage 210 determines the extent to which specific design samples 202 included in the design space perform various behaviors. An advantage of this approach is that sample scoring 712 can be used to train functions to predict the behaviors of robot designs based on parameter sets. These functions can be used to inform the robot design process, as will be discussed in detail below. As with generative stage 200, the disclosed techniques are equally applicable to other types of robots beyond quadruped robots. The operation of scoring stage 210 is described in stepwise fashion below in conjunction with FIG. 9.

Figure 9:
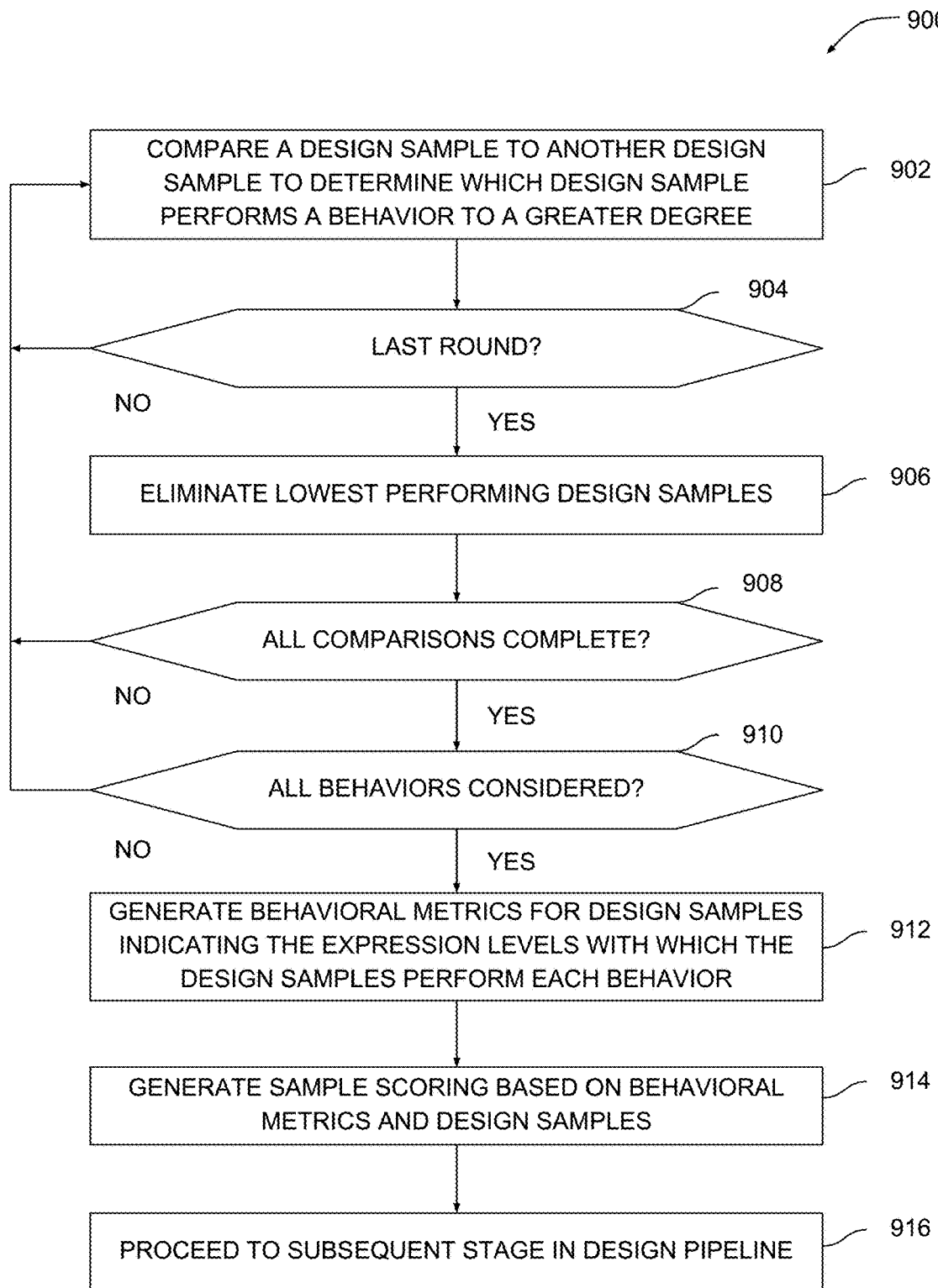
FIG. 9 is a flow diagram of method steps for generating one or more behavioral metrics associated with a set of design samples, according to various embodiments of the present invention.

FIG. 9 is a flow diagram of method steps for generating one or more behavioral metrics associated with a set of design samples, according to various embodiments of the present invention. Although the method steps are described in conjunction with the systems of FIGS. 1-8, persons skilled in the art will understand that any system configured to perform the method steps in any order falls within the scope of the present invention.

As shown, a method 900 begins at step 902, where tournament engine 700 within scoring stage 210 compares a design sample 202(0) to another design sample 202(1) to determine which design sample performs behavior 704 to a greater degree. Tournament engine 700 performs step 902 during a round 702. Comparator 706 within tournament engine 700 implements the comparison between design samples. Comparator 706 may implement an ANN or a set of heuristics to compare design samples, among other options. Comparator 706 may also outsource and/or crowdsource the comparison of design samples to one or more humans. Comparator 706 updates sample rankings 708 to reflect which design sample 202 best performs behavior 708. In one embodiment, the selected design sample 202 is considered the winner of round 702 and the rank of that design sample is increased in relation to behavior 704.

At step 904, tournament engine 700 determines whether the current round of comparisons is the last round in the current set of rounds. Tournament engine 700 can perform any number of different sets of rounds. If the current round is not the last round, then the method returns to step 902. Otherwise, the method 900 proceeds to step 906. At step 906, tournament engine 700 eliminates the lowest performing design samples. Low performing design samples could be those that are rarely or never selected as the winner of a round 702 (or the winner of a comparison when rounds include multiple comparisons). Eliminating design samples in this manner reduces the number of comparisons needed during subsequent rounds.

At step 908, tournament engine 700 determines whether all rounds of comparisons are complete. If additional rounds of comparisons remain, then the method returns to step 902, otherwise the method proceeds to step 910. At step 910, tournament engine 700 determines whether all behaviors have been considered. Tournament engine 700 can compare design samples 202 relative to one behavior or many behaviors, including many different actions and many different emotional expressions. Tournament engine 700 implements steps 902, 904, 906, and 908 for each of the different behaviors under consideration. In one embodiment, tournament engine 700 implements step 906 only after all rounds are complete for all behaviors. Then, tournament engine 700 eliminates design samples that do not identifiably perform any behaviors to a significant extent. If additional behaviors remain, then the method 900 returns to step 902 and proceeds with additional sets of rounds for the additional behaviors. Otherwise, the method proceeds to step 912.

At step 912, metric engine 720 within scoring stage 210 generates behavioral metrics 712 for design samples 202 indicating the expression levels with which those design samples perform each behavior. The behavioral metrics for a given design sample 202 indicate the degree to which that design sample performs each of the different behaviors. Metric engine 720 generate behavioral metrics 712 by processing sample ranking 708 and scoring each design sample 202 relative to a different behavior.

At step 914, scoring engine 730 generates sample scoring 212 based on behavioral metrics 712 and design samples 202. Sample scoring 212 is a data set that combines the design samples 202 that survived rounds 702 with associated behavioral metrics 712. At step 916, scoring stage 210 is complete and proceeds to the subsequent stage in design pipeline 120; evaluation stage 220. Evaluation stage 220 is described in greater detail below in conjunction with FIGS. 10-12.

Evaluation Stage

FIG. 10 is a more detailed illustration of the evaluation stage of FIG. 2, according to various embodiments of the present invention. As shown, evaluation stage 220 includes a mapping engine 1000 and a convergence engine 1010, pipelined together.

In operation, mapping engine 1000 iteratively processes design samples 202 and corresponding behavioral metrics 712 to determine how the parameter set of a given design sample can be used to predict the expression level of a particular behavior. During a given iteration 1002, an evaluator 1004 generates/and or updates a behavior predictor 1006 based on a design sample 202(0) and corresponding behavioral metrics 712(0). Behavior predictor 1006 is a function for estimating the expression level of a particular behavior based on a parameter set. Initially, behavior predictor 1006 may not accurately predict expression levels. Over the course of many iterations 1002, evaluator 1004 updates behavior predictor 1006 to estimate the expression level of the particular behavior with greater accuracy. Evaluator 1006 can implement several approaches to iteratively improving a behavior predictor 1006.

In one embodiment, behavior predictor 1006 may be a function of different weighted variables. Over many iterations 1002, evaluator 1004 modifies the weightings of these variables via a regression operation to cause the function to more accurately predict the expression level of the particular behavior. In another embodiment, behavior predictor 1006 may be an ANN and one or more iterations 1002 represent a training epoch. During one such training epoch, evaluator 1004 modifies the ANN via a gradient-descent based training operation to cause the ANN to more accurately classify the expression level of a particular behavior based on a given parameter set 404.

Figure 11:
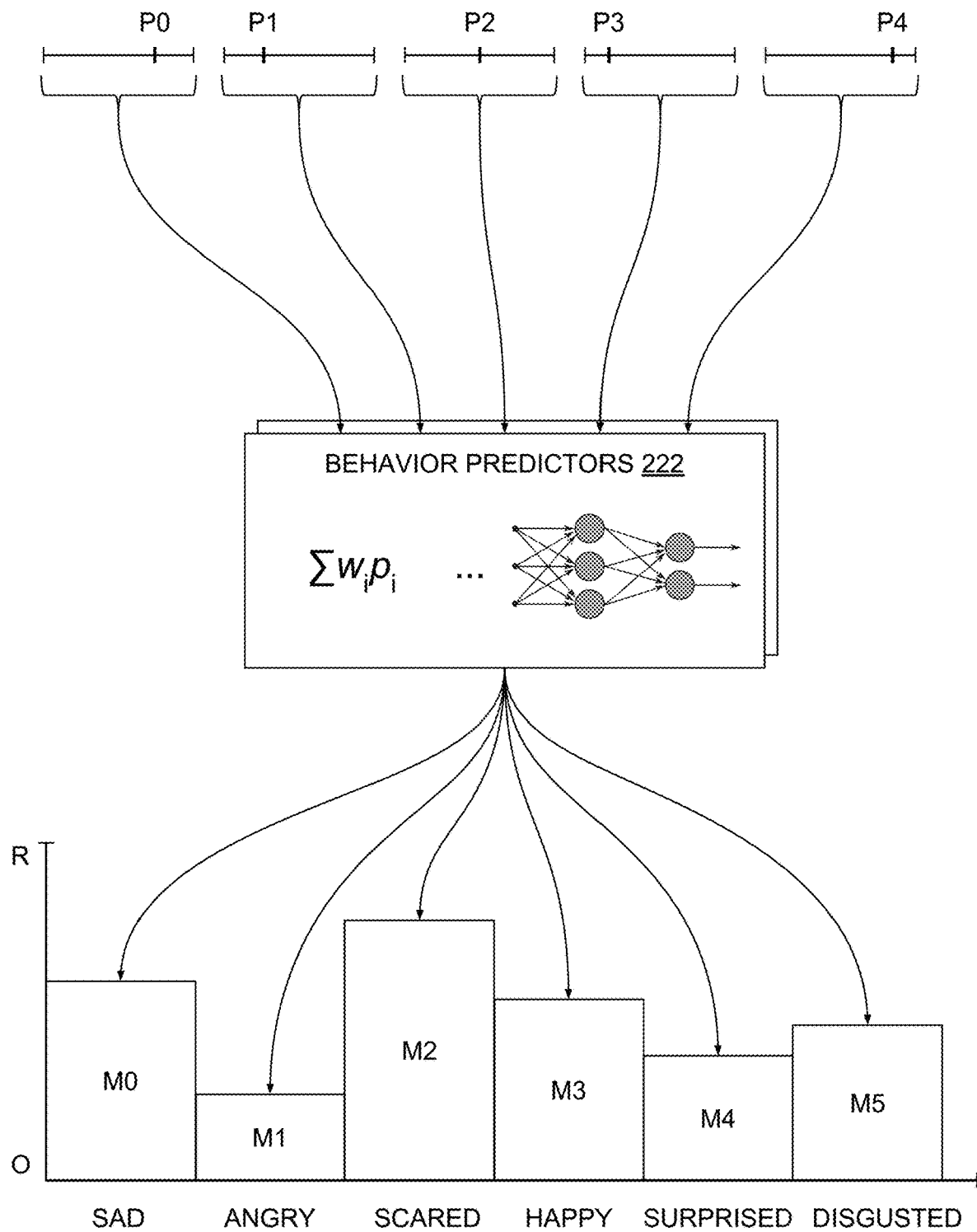
FIG. 11 is a more detailed illustration of the behavior predictors of FIG. 10, according to various embodiments of the present invention.

Convergence engine 1010 monitors iterations 1002 to determine whether the behavior predictor 1006 for a given behavior can predict the expression level of that behavior with reasonable accuracy. For example, convergence engine 1010 could test the behavior predictor 1006 for "happiness" by determining how closely that behavior predictor estimates the expression of happiness based on a given parameter set 404. Convergence engine 1010 implements any technically feasible convergence criterion. For example, convergence engine 1010 could determine that the accuracy of a given behavior predictor 1006 exceeds a threshold value. Convergence engine 1010 stores any converged behavior predictors 1006 into behavior predictors 222, also shown in FIG. 2. FIG. 11 illustrates how behavior predictors 222 can predict behavioral metrics 712.

Referring now to FIG. 11, as shown, behavior predictors 222 receive parameters P0 through P4 as input and then generate expression levels M0 through M5 as output. As mentioned, behavior predictors 222 can be implemented via functions of weighted variables or via ANNs, among other approaches. In one embodiment, both approaches are used in conjunction with one another. Each behavior predictor 222 is configured to predict the expression level of a different behavior. For example, a behavior predictor 222 corresponding to a "scared" behavior analyzes parameters P0 through P4 to generate expression level M2. Expression level M2 indicates the degree to which a simulated robot configured with parameters P0 through P4 performs a "scared" behavior. Similarly, for example, a different behavior predictor 222 corresponding to a "surprised" behavior analyzes parameters P0 through P4 to generate expression level M4. Expression level M4 indicates the degree to which the simulated robot configured with parameters P0 through P4 performs a "surprised" behavior.

Generating behavior predictors 222 in the manner described above is an important step in design pipeline 120 because these behavior predictors 222 can be used to guide the generation of robot designs that perform desired behaviors. For example, a behavior predictor 222 for "tip-toeing" could be used to inform parameter changes that would cause a current robot design to more expressively tip-toe. Designing robots based on predictor functions 222 is described in greater detail below in conjunction with FIGS. 13-15C. As with the other stages of design pipeline 120, the disclosed techniques are equally applicable to other types of robots beyond quadruped robots. The operation of evaluation stage 220 is described in stepwise fashion below in conjunction with FIG. 12.

Figure 12:
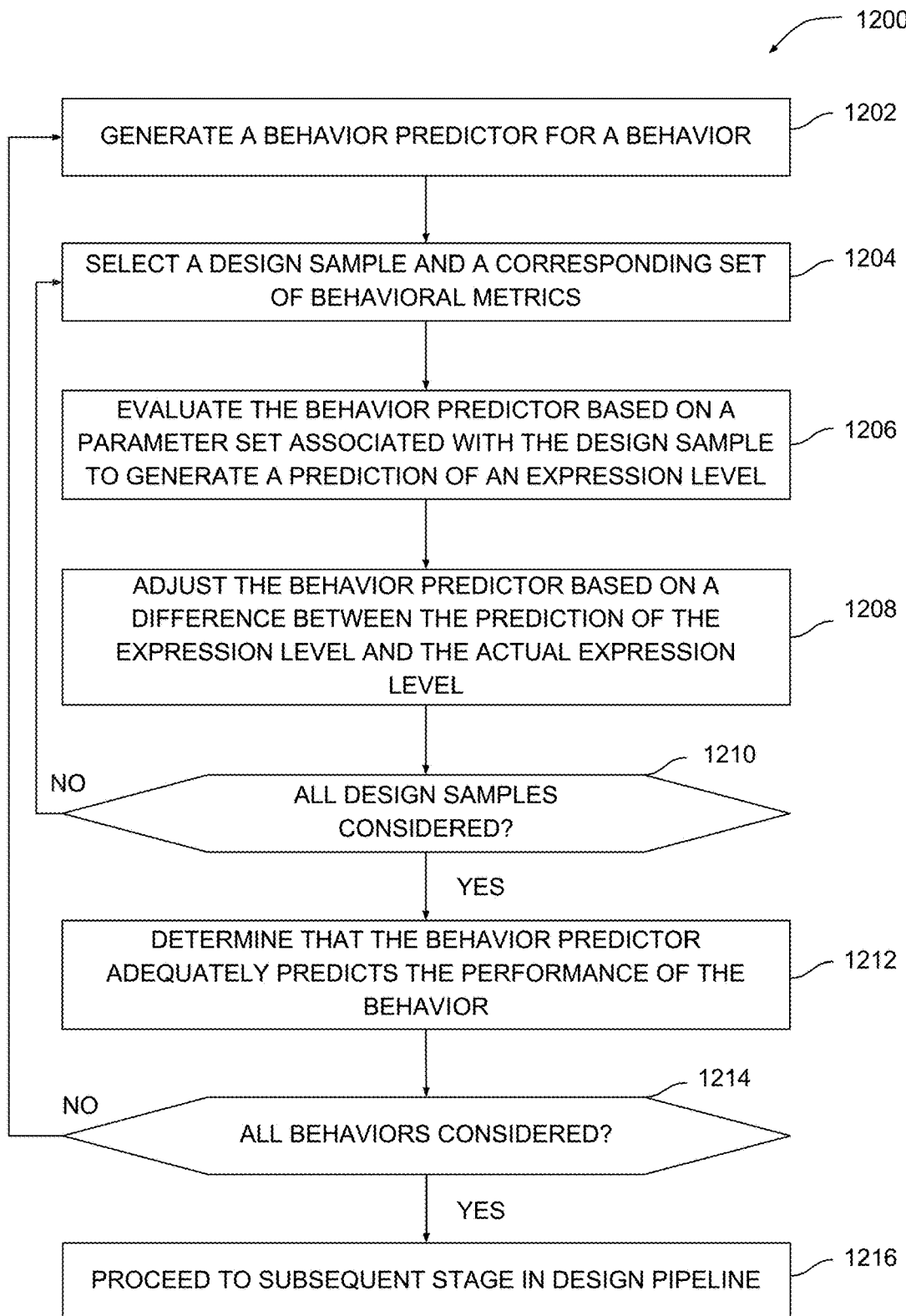
FIG. 12 is a flow diagram of method steps for generating a behavior predictor that predicts the expression level of a robot behavior, according to various embodiments of the present invention.

FIG. 12 is a flow diagram of method steps for generating a behavior predictor that predicts the expression level of a robot behavior, according to various embodiments of the present invention. Although the method steps are described in conjunction with the systems of FIGS. 1-11, persons skilled in the art will understand that any system configured to perform the method steps in any order falls within the scope of the present invention.

As shown, a method 1200 begins at step 1202, where mapping engine 1000 within evaluation stage 220 generates an initial version of a behavior predictor 1006 for a behavior. The behavior could be a particular action such as "waving" or the expression of an emotion, such as "glee." The initial version of the behavior predictor 1006 may include a randomized mapping or a function with randomized parameter weights, among other options.

At step 1204, mapping engine 1000 initiates an iteration 1002 by selecting a design sample 202 and a corresponding set of behavioral metrics 712. The behavioral metrics for a given design sample generally include expression levels for many different behaviors, as illustrated by way of example in FIG. 8B. During an iteration 1002, though, mapping engine 1000 usually considers the expression level of just one behavior because each behavior predictor 1006 is meant to predict the performance of only one behavior.

At step 1206, evaluator 1004 within mapping engine 1000 evaluates the behavior predictor 1006 based on a parameter set associated with the design sample 202 to generate a prediction of an expression level associated with the behavior. For example, evaluator 1004 could process the parameter set 404 associated with design sample 202 using the behavior predictor 1006 and then estimate the expression level of a given behavior. Evaluator 1004 would then compare the estimated expression level to the actual expression level indicated in the associated behavioral metrics.

At step 1208, evaluator 1004 adjusts the behavior predictor 1006 based on a difference between the prediction of the expression level and the actual expression level. In one embodiment, evaluator 1004 may implement a regression operation to iteratively improve a function of several weighted variables based on an error value associated with that function. Evaluator 1004 may adjust the weightings of these variables to cause the function to reduce the error value and more accurately predict the expression level of the behavior. Evaluator 1004 may perform step 1208 over one or more iterations.

At step 1210, mapping engine 1000 determines whether all design samples 202 have been considered. Mapping engine 1000 can initiate iterations 1002 for some or all design samples 202 and corresponding behavioral metrics 712. In one embodiment, mapping engine 1000 uses some pairs of design samples 202 and behavioral metrics 712 for improving the behavior predictor 1006, and reserves other pairs of design samples 202 and behavioral metrics 712 for testing the behavior predictor 1006. If additional design samples remain, then the method 1200 returns to step 1204. Otherwise, the method proceeds to step 1212.

At step 1212, convergence engine 1010 within evaluation stage 220 determines that the adjusted version of the behavior predictor 1006 adequately predicts the performance of the behavior. Convergence engine 1010 may test the behavior predictor at each iteration and then identify convergence when an error rate associated with behavioral predictions falls beneath a threshold, among other possibilities. Convergence engine 1010 stores converged behavior predictors 1006 as behavior predictors 222.

At step 1214, convergence engine 1010 determines whether all behaviors have been considered. Generally, mapping engine 1000 and convergence engine 1010 analyze the relationships between design samples 202 and behavioral metrics 712 for each specific behavior separately in order to generate a behavior predictor 222 for that one behavior. If additional behaviors should be considered, then the method 1200 returns to step 1202. Otherwise, the method proceeds to step 1216. At step 1216, evaluation stage 220 is complete and proceeds to the final stage in design pipeline 120; design stage 230. Design stage 230 is described in greater detail below in conjunction with FIGS. 13-15C.

Design Stage

FIG. 13 is a more detailed illustration of the design stage of FIG. 2, according to various embodiments of the present invention. As shown, design stage 230 includes a design engine 1300.

Figure 14A:
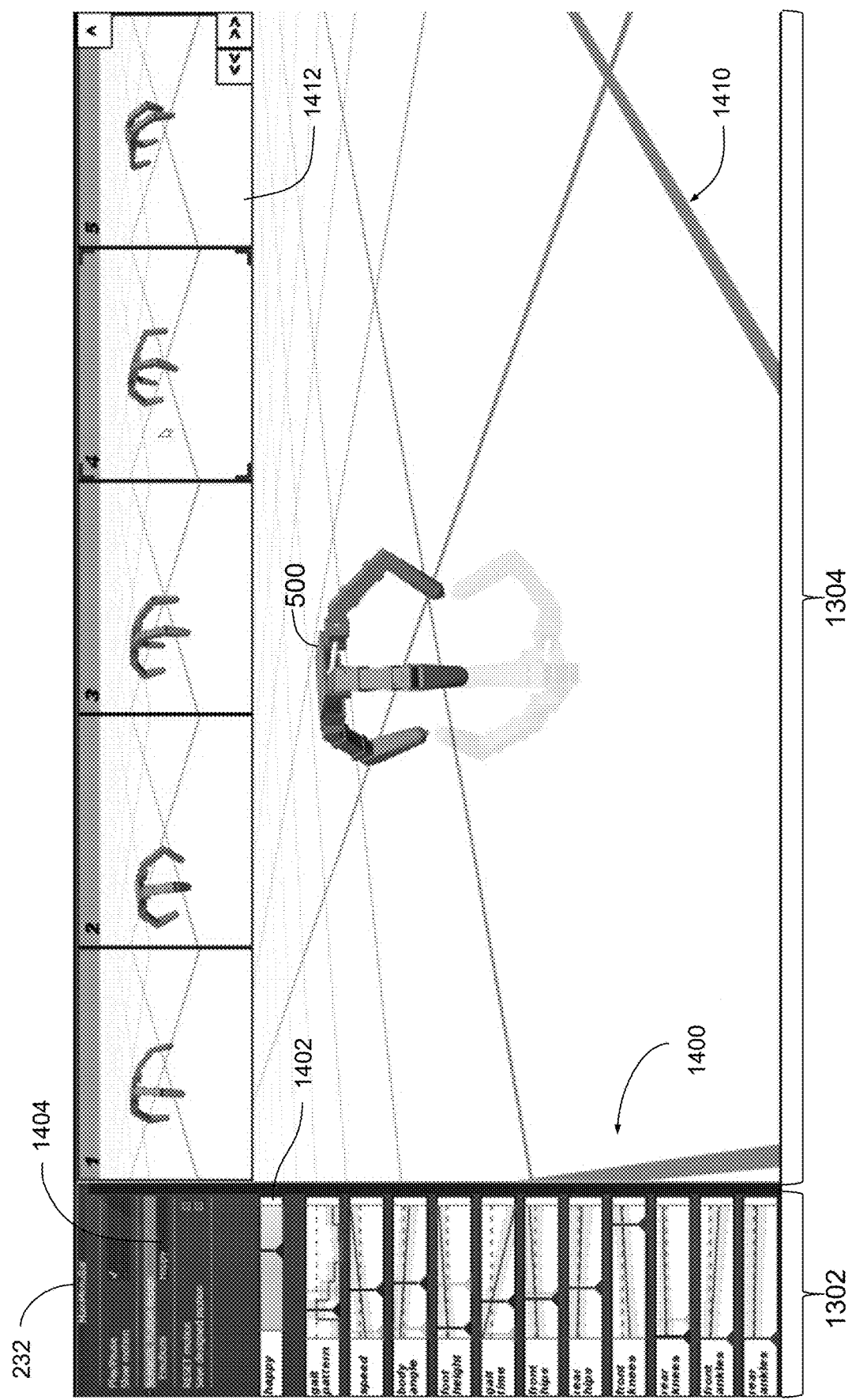
FIGS. 14A-14D are example illustrations of the design interface of FIG. 2, according to various embodiments of the present invention.

In operation, design engine 1300 generates design interface 232 with which a user can interact to generate a design for a robot. Design engine 1310 outputs design interface 232 to the user via display device 1330 and receives input from the user via input devices 1320. Design interface 232 includes a parameter interface 1302 and a robot interface 1304. Parameter interface 1302 exposes parameters associated with a particular type of robot. These parameters may be similar in nature to the parameter sets 404 included in design samples 202 discussed above. Robot interface 1304 displays animated clips of one or more simulated robots. FIG. 14A illustrates an example illustration of design interface 232.

Referring now to FIG. 14A, as shown, design interface 232 includes parameter interface 1302 and robot interface 1304. Parameter interface 1302 includes parameter sliders 1400, a behavior slider 1402, and a behavior selector 1404. Parameter sliders 1400 are GUI elements with which the user can interact to adjust specific parameters associated with the current robot design. Behavior slider 1402 is a GUI element with which the user can interact to indicate the expression level with which the current robot design should perform a desired behavior. Behavior selector 1404 allows the user to specify the desired behavior. Robot interface 1304 includes a simulation pane 1410 depicting simulated robot 500 shown in previous examples and a preview pane 1414 depicting other simulated robots. The user can select a previewed robot in preview pane 1414 to load a preconfigured set of parameters. Design engine 1300 generates and renders animated clips of simulated robots for display within robot interface 1304 based on the parameter settings defined via parameter interface 1302.

Figure 14B:
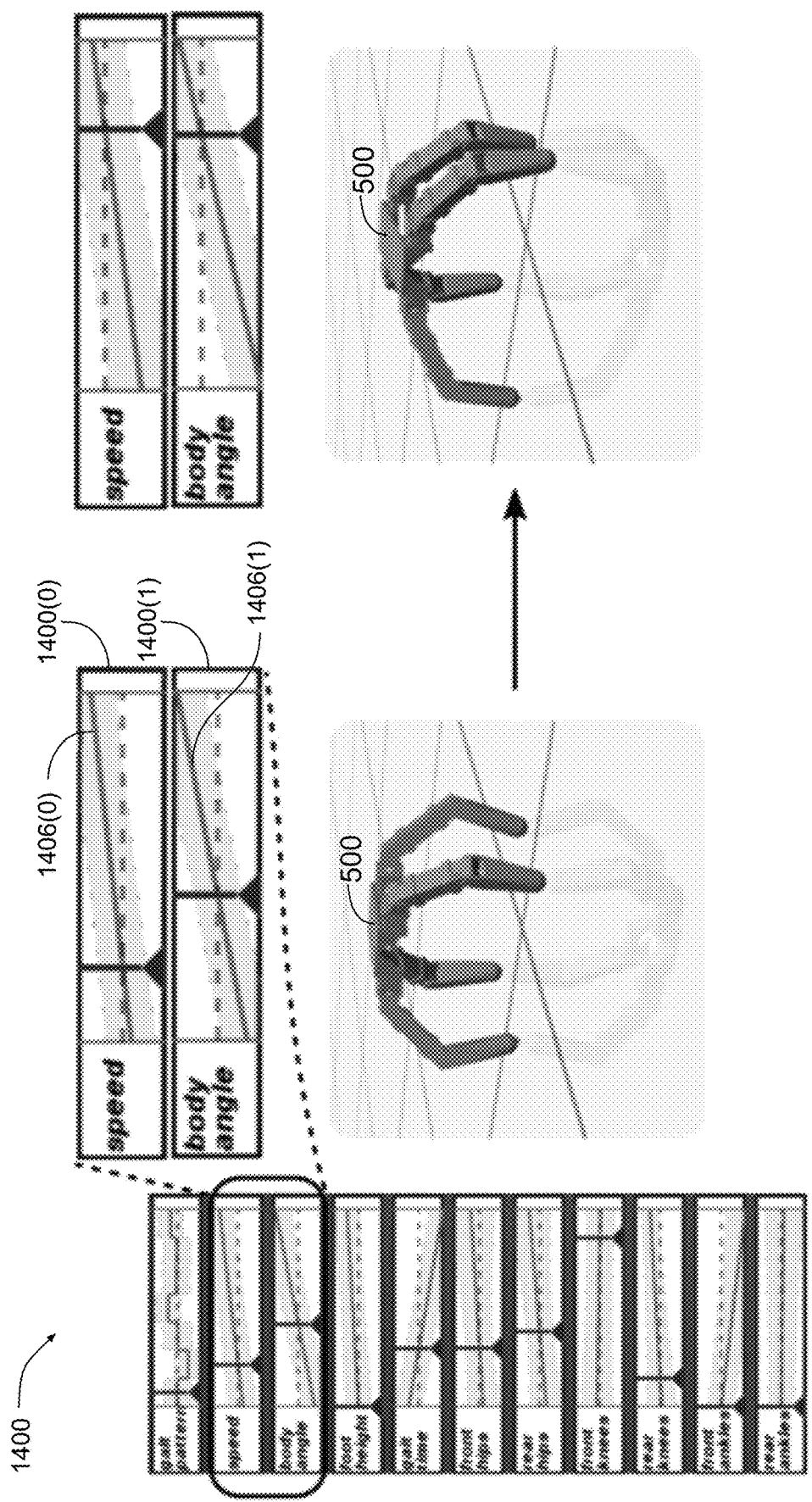

Design interface 232 generally operates according to two modes of operation, a parameter editing mode and a semantic editing mode. In the parameter editing mode, design engine 1300 generates and/or updates parameter sliders 1400 based on behavior predictors 222. Specifically, design engine 1300 generates "indicator curves" within parameter slider 1400 that indicate, for any given parameter, how changing the given parameter will affect the degree to which the current robot design performs a given behavior. FIG. 14B illustrates an example how design interface 232 operates in parameter editing mode.

Referring now to FIG. 14B, as shown, parameter sliders 1400 include exemplary parameters sliders 1400(0) and 1400(1), which are expanded for clarity. Parameter slider 1400(0) controls the speed of simulated robot 500 while parameter slider 1400(1) controls the body angle of simulated robot 500. Other parameter sliders control the values of other parameters. Parameter sliders 1400(0) and 1400(1) include indicator curves 1406(0) and 1406(1), respectively. A given indicator curve 1406 describes a correlation between different values for the associated parameter and different expression levels with which the simulated robot 500 performs a given behavior. Indicator curves 1406 thus also indicate how changing the associated parameter slider 1400 will influence the performance of a behavior specified by the user.

For example, suppose the specified behavior is "hurrying." Indicator curve 1406(0) could indicate that simulated robot 500 would more expressively perform a "hurrying" behavior if speed is increased. Thus, indicator curve 1406(0) would increase towards the right with an increasing setting for parameter slider 1400(0). Similarly, indicator curve 1406(1) could indicate that simulated robot 500 would more expressively perform the "hurrying" behavior if body angle is increased. Accordingly, indicator curve 1406(1) would increase towards the right with an increasing setting for parameter slider 1400(1). If the user adjusts parameter sliders 1400 to increase the exemplary "hurrying" behavior, design engine 1300 updates simulated robot 500 to reflect these parameter changes in the manner shown.

Design engine 1300 generates a given indicator curve 1406 by evaluating the behavior predictor 222 associated with the specified behavior across the available range for the parameter. Design engine 1300 also generates error bounds for the given indicator curve 1406 to represent a confidence interval with which the indicator curve 1406 can reliably indicate the effects of changing the associated parameter slider 1400. In one embodiment, design engine 1300 generates these error bounds based on the convergence of the associated behavior predictor 222 during iterations 1002. When generating a given indicator curve 1406, design engine 1300 maintains fixed values for the other parameters. If the user modifies a given parameter, design engine 1300 regenerates indicator curves 1406 based on the updated value for the modified parameter and updates simulated robot 500 to reflect the modified parameter.

Figure 14C:
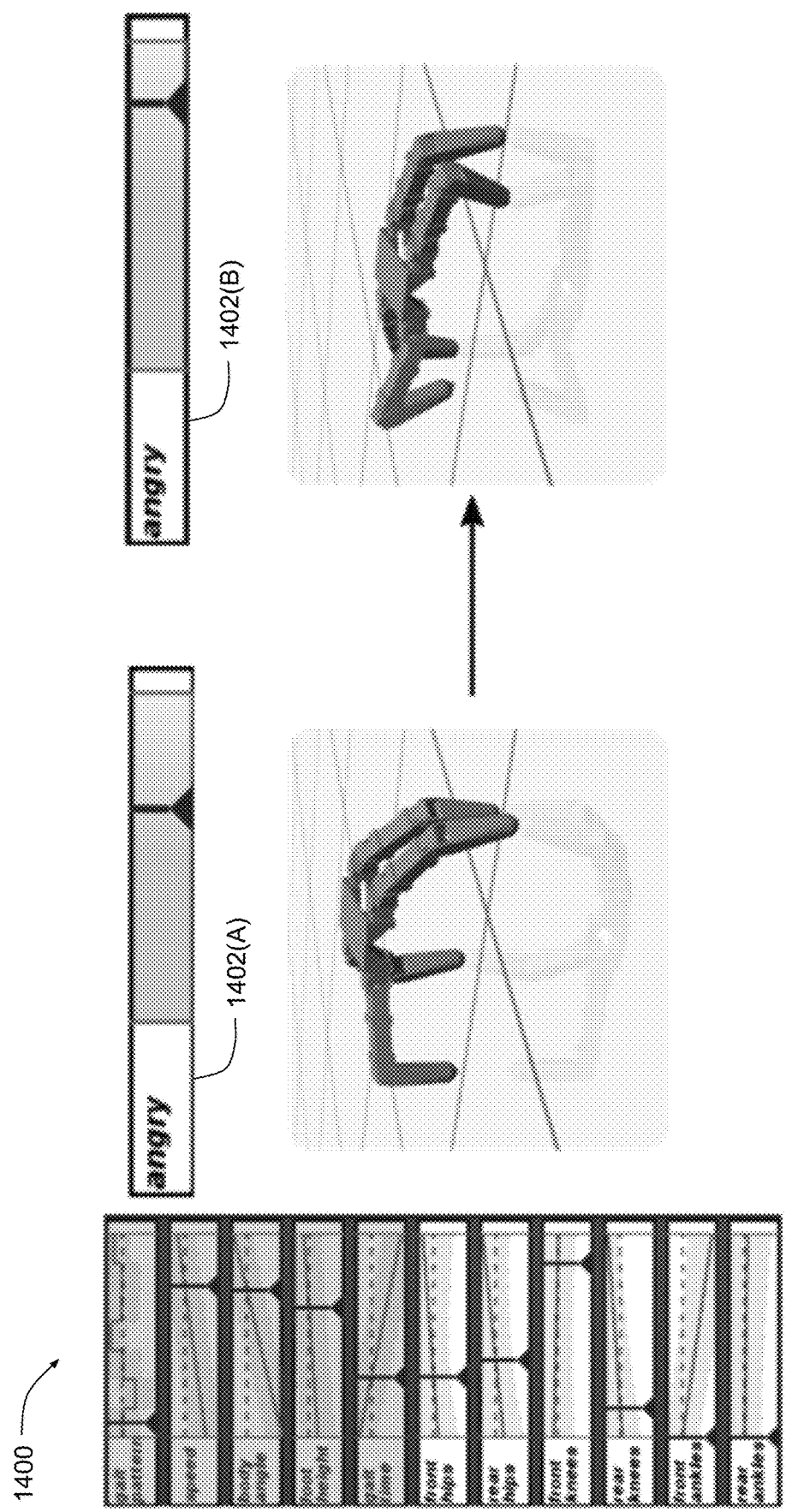

Referring back now to FIG. 14A, when the user modifies a given parameter, design engine 1300 also updates behavior slider 1402 to indicate the overall expression level with which the updated design of simulated robot 500 performs the specified behavior. Design engine 1300 determines this expression level using the relevant behavior predictor 222 and the current parameter settings. Behavior slider 1402 is also used when design interface 232 operates in semantic editing mode. When operating in semantic editing mode, the user can adjust behavior slider 1402 and design engine 1300 automatically updates the parameter settings to achieve a desired expression level. FIG. 14C illustrates an example of how design interface 232 operates in semantic editing mode.

As shown in FIG. 14C, exemplary behavior slider 1402 indicates the current expression level with which simulated robot 500 appears angry. The user can modify behavior slider 1402 from an initial state 1402(A) to an updated state 1402(B) to increase the degree to which simulated robot 500 appears angry. In one embodiment, when the user modifies behavior slider 1402, design engine 1300 iteratively increases or decreases different parameters until a combination of parameters is reached which accomplishes the desired level of expression. In another embodiment, design engine 1300 modifies parameter settings based on corresponding indicator curves. Generally, design engine 1300 uses the appropriate behavior predictor 222 to determine how the different parameters should be adjusted. Design engine 1300 also allows the user to lock certain parameters during semantic editing. For example, the user could desire an increased expression of "hurrying," yet prefer that the pose of simulated robot 500 not change. The user can then lock this parameter during editing.

One significant advantage of design interface 232 is that even novice users can effectively design robots to perform specific behaviors and express specific emotional states. Importantly, a user need not have specialized skills in graphical design or programming to use design interface 232. In addition, the user need not interact with any other users, thereby greatly simplifying and expediting the robot design process. Although design engine 1300 generates design interface 232 based on data produced via the first three stages of design pipeline 120, the operation of these stages can be partially or completely transparent to the user.

Figure 14D:
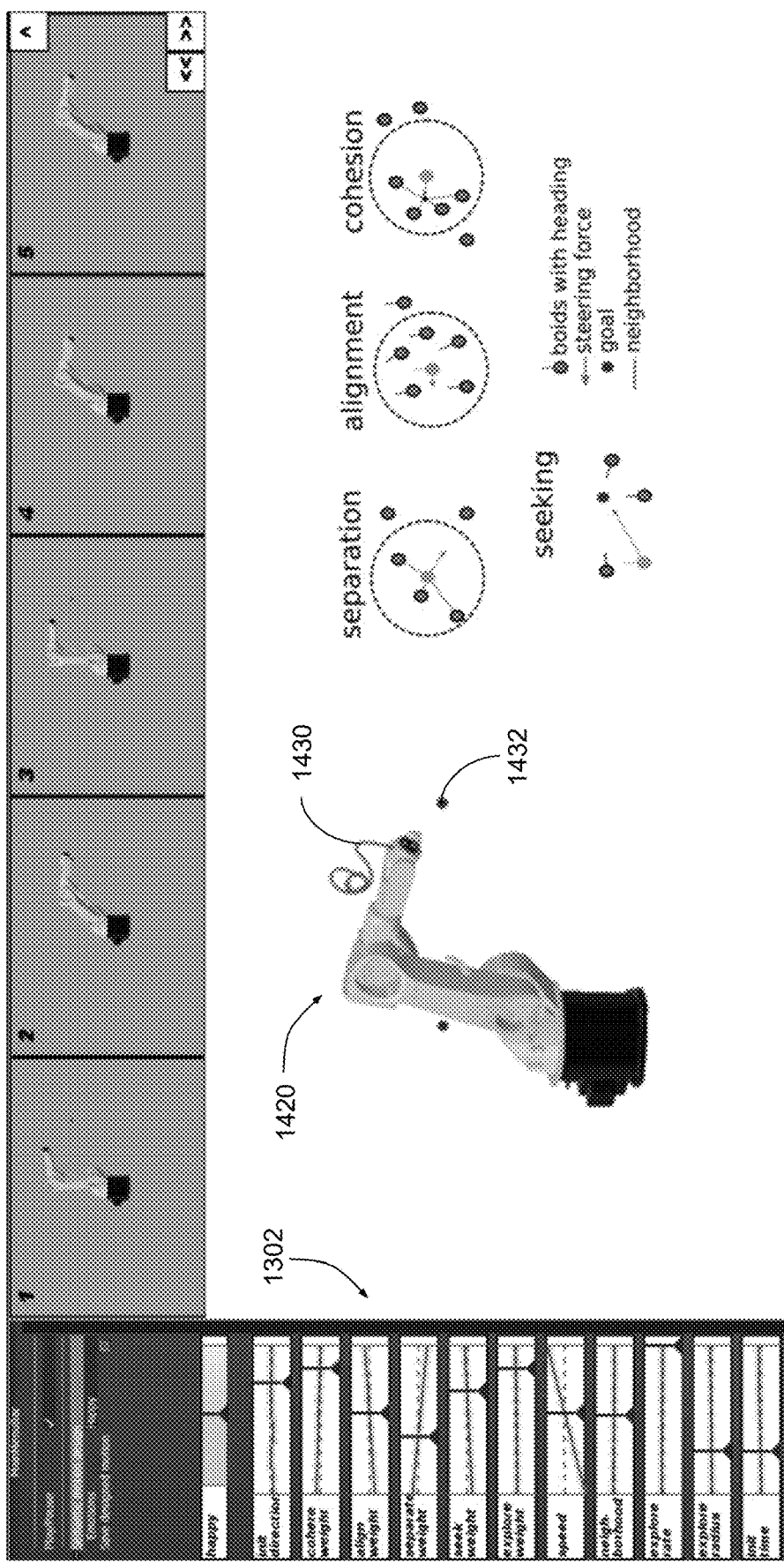

As a general matter, although many of the foregoing examples have been described in relation to a quadruped robot, any of the features of design interface 232, and any of the other functionalities described herein, can be applied to other types of robots as well. FIG. 14D illustrates an example of how design interface 232 can be used to generate a design for robotic arm.

Referring now to FIG. 14D, as shown, the dynamics of a robotic arm 1420 are described by parameter settings shown in parameter interface 1302. In this example, a simulation paradigm known in the art as "boids" is used to determine how robotic arm 1420 moves along path 1430 to a goal 1432. Specifically, the position of robotic arm 1420 at any given time is determined based on a group of agents called "boids" which flock according to specific parameters. Those parameters dictate the separation, alignment, and cohesion between boids, as well as boid steering, among other things. The user can modify these parameters via parameter interface 1302.

When the user generates designs for robotic arm 1420, design engine 1300 implements behavior predictors 222 to update indicator curves 1406 and behavior sliders 1402 in like fashion as described above in conjunction with FIGS. 14B and 14C. These behavior predictors are generated via design pipeline 120 in the manner previously described in relation to the quadruped example. In particular, generative stage 200 generates design samples depicting many different robotic arm designs. Scoring stage 210 generates behavioral metrics for these robotic arm designs. Evaluation stage 230 generates behavior predictors to predict the expression level of a given robotic arm based on parameter settings. As a general matter, design pipeline 120 as a whole can be used to design robots of any technically feasible variety.

Referring generally to FIGS. 14A-14D, design engine 1300 is configured to generate any of the GUI elements of design interface 232 by performing the procedure described below in conjunction with FIGS. 15A-15C.

Figure 15A:
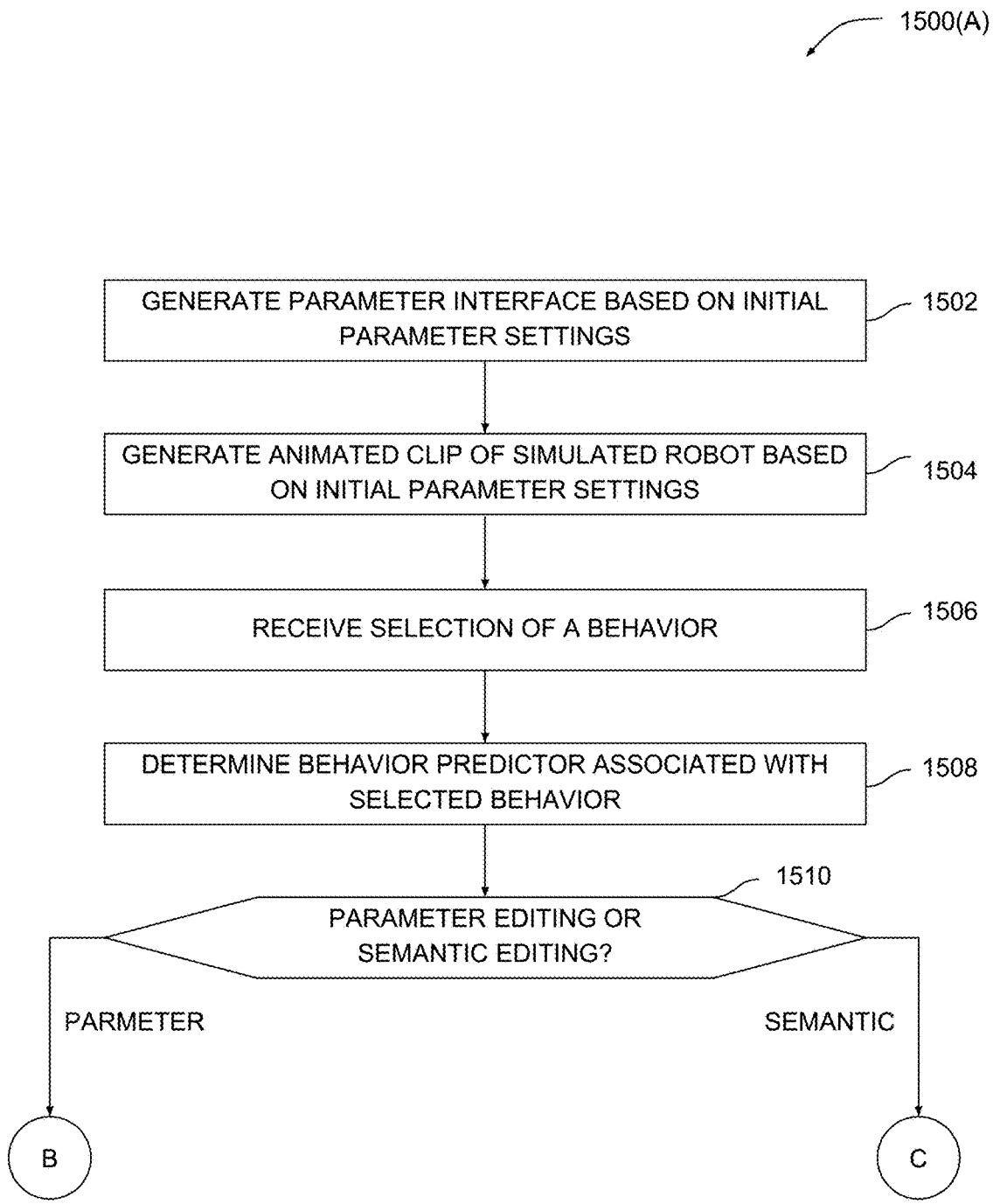
FIGS. 15A-15C set forth a flow diagram of method steps for generating a user interface that is configured to guide a user when generating a robot design, according to various embodiments of the present invention.
Figure 15B:
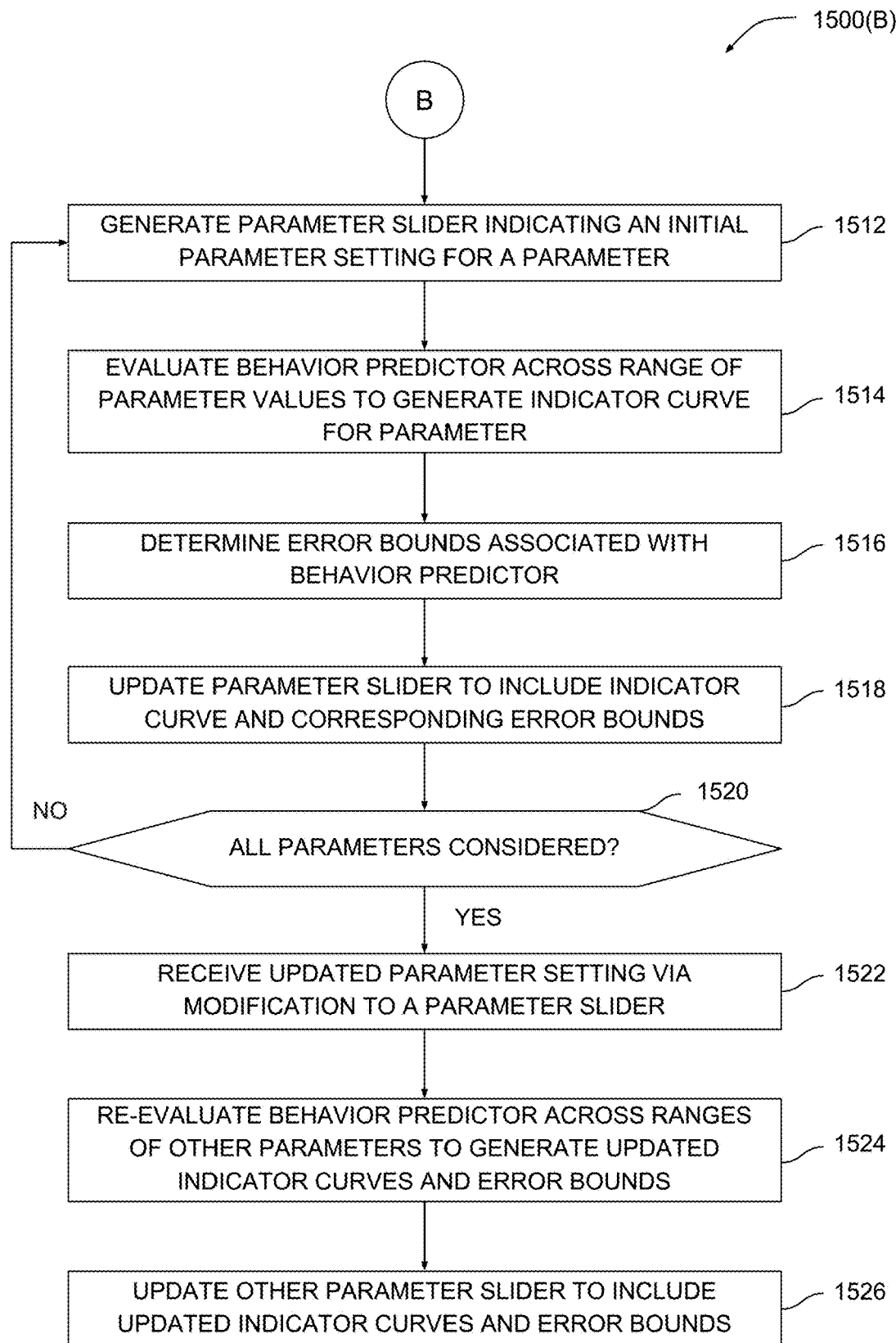
Figure 15C:
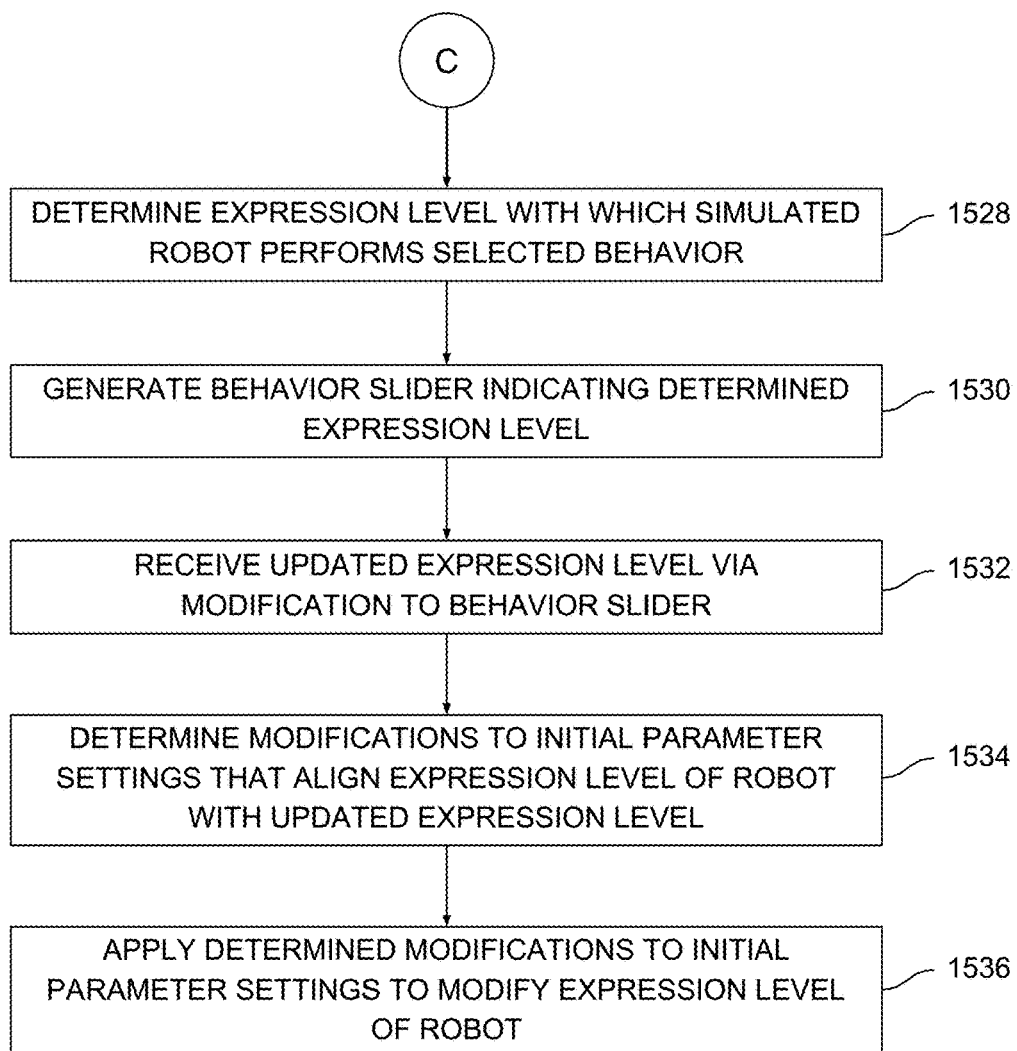

FIGS. 15A-15C set forth a flow diagram of method steps for generating a user interface that is configured to guide a user when generating a robot design, according to various embodiments of the present invention. Although the method steps are described in conjunction with the systems of FIGS. 1-14D, persons skilled in the art will understand that any system configured to perform the method steps in any order falls within the scope of the present invention.

As shown, a method 1500(A) begins at step 1502, where design engine 1300 within design stage 230 generates parameter interface 1302 based on initial parameter settings. Within parameter interface 1302, design engine 1300 generates parameter sliders 1400, behavior slider 1402, and behavior selector 1404. The initial parameter settings correspond to a particular type of robot being designed, such as a quadruped robot or robotic arm, among others.

At step 1504, design engine 1300 generates an animated clip of a simulated robot based on the initial parameter settings. Design engine 1300 simulates a robot model that is configured based on the initial parameter settings and then renders a clip depicting the dynamics of the configured model. Design engine 1300 displays the animated clip in robot interface 1304.

At step 1506, design engine 1300 receives a selection of a behavior via behavior selector 1404. The selected behavior could be an action, a task, a state of being, an emotional state, and so forth. For example, the selected behavior could be the expression of sadness or the performance of a particular mannerism. At step 1508, design engine 1300 determines the behavior predictor 222 associated with the selected behavior. The determined behavior predictor can be used to guide the user in editing the design. At step 1510, design engine 1300 determines whether to perform parameter editing or semantic editing. If parameter editing is to be performed, then the method proceeds in the manner described below in conjunction with FIG. 15B. If semantic editing is to be performed, then the method proceeds in the manner described below in conjunction with FIG. 15C.

Referring now to FIG. 15B, when parameter editing is to be performed, the method 1500(A) continues as the method 1500(B), as shown. At step 1512, design engine 1300 generates a parameter slider element 1400 indicating an initial parameter setting for a parameter. In the case of a quadruped robot, the parameter could be walking speed, among others. In the case of a robotic arm, the parameter could be a cohesion value for a group of boids or other group of flocking agents.

At step 1514, design engine 1300 evaluates the behavior predictor determined at step 1508 across a range of parameter values to generate an indicator curve 1406 for the parameter. The indicator curve indicates how changing the associated parameter affects the expression level of a given behavior. For example, a given indicator curve could indicate that reducing the knee joint angle of a quadruped robot could cause the robot to appear happier. At step 1516, design engine 1300 determines error bounds associated with the behavior predictor. Design engine 1300 could determine the error bounds for a given behavior predictor based on the amount of training data used to generate the behavior predictor, for example. At step 1518, design engine 1300 updates the parameter slider 1400 associated with the parameter to include the indicator curve 1406 and corresponding error bounds. At step 1520, design engine 1300 determines whether all parameters associated with the robot have been considered. If additional parameters remain, then the method returns to step 1512. Otherwise, the method proceeds to step 1522.

At step 1522, design engine 1300 receives an updated parameter setting via modification to a parameter slider 1400. In response, at step 1524, design engine 1300 re-evaluates the behavior predictor 222 across the ranges of other parameters to generate updated indicator curves and error bounds for those other parameters. Design engine 1300 generates updated indicator curves because changing one parameter affects the predicted effects of changing any other parameter. At step 1526, design engine 1300 updates the other parameter sliders 1400 to include updated indicator curves 1406 and error bounds.

Referring now to FIG. 15C, when parameter editing is to be performed, the method 1500(A) continues as the method 1500(C), as shown. At step 1528, design engine 1300 determines an expression level with which the robot design performs the selected behavior. In doing so, design engine 1300 evaluates the behavior predictor 222 using the current parameters to estimate the current expression level achieved by design. At step 1530, design engine 1300 generates behavior slider 1402 indicating the determined expression level. The user can modify behavior slider 1402 to change the expression level of the selected behavior.

At step 1532, design engine 1300 receives an updated expression level via modification to behavior slider 1402. For example, the user may wish to increase a "perkiness" behavior associated with the robot design. Accordingly, the user increases behavior slider 1402 configured to indicate how perky the current robot design may appear.

At step 1534, design engine 1300 determines modifications to the initial parameter settings that align the expression level of the current design with the updated expression level. Design engine 1300 could iteratively increase or decrease different parameters until a combination of parameters is reached which accomplishes the desired level of expression, or modify parameter settings based on corresponding indicator curves, among other approaches. At step 1536, design engine 1300 applies the determined modifications to the initial parameter settings to modify the expression level of the design. Design engine 1300 also re-renders a simulated robot to display the updated behavior to the user.

Referring generally to FIGS. 15A-15C, the parameter editing mode and the semantic editing mode can be used in conjunction with one another to generate and/or edit robot designs. For example, the user could pre-load a set of parameters for a "happy" robot, and tweak the individual parameters in an effort to increase the expression of happiness. Then, the user could simply increase the behavior slider 1402 configured to display the current happiness level, and design engine 1300 would automatically update the relevant parameters.

In sum, an automated robot design pipeline facilitates the overall process of designing robots that perform various desired behaviors. The disclosed pipeline includes four stages. In the first stage, a generative engine samples a design space to generate a large number of robot designs. In the second stage, a metric engine generates behavioral metrics indicating a degree to which each robot design performs the desired behaviors. In the third stage, a mapping engine generates a behavior predictor that can predict the behavioral metrics for any given robot design. In the fourth stage, a design engine generates a graphical user interface (GUI) that guides the user in performing behavior-driven design of a robot.

At least one advantage of the disclosed approach is that the user need not have specialized skills in either graphic design or programming to generate designs for robots that perform specific behaviors or express various emotions. Accordingly, expressive robots can be designed more efficiently and with less reliance on seasoned experts. Another advantage of the disclosed approach is that a single user can effectively generate a robot design without needing to interoperate with other users. Thus, the overall process for generating a robot design can be expedited compared to conventional robot design processes that involve multiple participants. For these reasons, the disclosed approach confers multiple technical advancements compared to prior art approaches.

1. Some embodiments include a computer-implemented method for automatically generating design parameter values when designing a robot, the method comprising generating a first mapping based on a plurality of sets of design parameter values, wherein the first mapping indicates that a first robot model configured according to a first set of design parameter values performs a first behavior with a first expression level, generating a first behavior slider with which a user interacts to modify an expression level with which the first robot model performs the first behavior, wherein the first behavior slider indicates different expression levels with which the first robot model performs the first behavior when configured according to different sets of design parameter values, receiving first user input via the first behavior slider indicating that the first robot model should perform the first behavior with a second expression level, and modifying the first set of design parameter values based on the first mapping to generate a second set of design parameter values, wherein the first robot model performs the first behavior with the second expression level when configured according to the second set of design parameter values.

2. The computer-implemented method of clause 1, further comprising generating a first design parameter slider with which a user interacts to modify a first design parameter, wherein the first design parameter slider includes a first indicator curve that indicates a first correlation between a first range of design parameter values and a first range of expression levels with which the first robot model performs the first behavior when configured according to specific design parameter values within the first range of design parameter values.

3. The computer-implemented method of any of clauses 1-2, further comprising evaluating the first mapping across the first range of design parameter values to generate the first indicator curve.

4. The computer-implemented method of any of clauses 1-3, further comprising updating the first indicator curve to include a first error bound that indicates an uncertainty level associated with the first correlation.

5. The computer-implemented method of any of clauses 1-4, wherein the first design parameter slider initially occupies a first position corresponding to a first design parameter value, and further comprising receiving second user input via the first design parameter slider, wherein the second user input indicates a second design parameter value, causing the first design parameter slider to occupy a second position corresponding to the second design parameter value in response to the second user input, and configuring the first robot model according to the second design parameter value to perform the first behavior with a third expression level.

6. The computer-implemented method of any of clauses 1-5, further comprising generating a second design parameter slider with which the user interacts to modify a second design parameter, wherein the second design parameter slider includes a second indicator curve that indicates a second correlation between a second range of design parameter values and a second range of expression levels with which the first robot model performs the first behavior when configured according to specific design parameter values within the second range of design parameter values.

7. The computer-implemented method of any of clauses 1-6, wherein modifying the first set of design parameter values comprises modifying a first design parameter value included in the first set of design parameter values to generate a second design parameter value, evaluating the first mapping based on the second design parameter value to generate an estimated expression level with which the first robot model should perform the first behavior when configured according to the second design parameter value, and determining that the estimated expression level is equivalent to the second expression level, wherein the second set of design parameter values includes the second design parameter value.

8. The computer-implemented method of any of clauses 1-7, further comprising locking a first design parameter value in response to second user input, wherein the first design parameter value is not modified during modification of the first set of design parameter values.

9. The computer-implemented method of any of clauses 1-8, further comprising generating a first behavior selector with which a user interacts to select the first behavior, and updating the first behavior selector based on second user input to indicate the first behavior.

10. The computer-implemented method of any of clauses 1-9, wherein generating the first mapping comprises iteratively performing a regression operation between the first expression level and different sets of design parameter values included in the plurality of design parameter values.

11. Some embodiments include a non-transitory computer-readable medium storing program instructions that, when executed by one or more processors, cause the one or more processors to automatically generate design parameter values when designing a robot by performing the steps of generating a first mapping based on a plurality of sets of design parameter values, wherein the first mapping indicates that a first robot model configured according to a first set of design parameter values performs a first behavior with a first expression level, generating a first behavior slider with which a user interacts to modify an expression level with which the first robot model performs the first behavior, wherein the first behavior slider indicates different expression levels with which the first robot model performs the first behavior when configured according to different sets of design parameter values, receiving first user input via the first behavior slider indicating that the first robot model should perform the first behavior with a second expression level, and modifying the first set of design parameter values based on the first mapping to generate a second set of design parameter values, wherein the first robot model performs the first behavior with the second expression level when configured according to the second set of design parameter values.

12. The non-transitory computer-readable medium of clause 11, further comprising the step of generating a first design parameter slider with which a user interacts to modify a first design parameter, wherein the first design parameter slider includes a first indicator curve that indicates a first correlation between a first range of design parameter values and a first range of expression levels with which the first robot model performs the first behavior when configured according to specific design parameter values within the first range of design parameter values.

13. The non-transitory computer-readable medium of any of clauses 11-12, further comprising evaluating the first mapping across the first range of design parameter values to generate the first indicator curve.

14. The non-transitory computer-readable medium of any of clauses 11-13, further comprising updating the first indicator curve to include a first error bound that indicates an uncertainty level associated with the first correlation.

15. The non-transitory computer-readable medium of any of clauses 11-14, wherein the first design parameter slider initially occupies a first position corresponding to a first design parameter value, and further comprising receiving second user input via the first design parameter slider, wherein the second user input indicates a second design parameter value, causing the first design parameter slider to occupy a second position corresponding to the second design parameter value in response to the second user input, and configuring the first robot model according to the second design parameter value to perform the first behavior with a third expression level.

16. The non-transitory computer-readable medium of any of clauses 11-15, further comprising generating a second design parameter slider with which the user interacts to modify a second design parameter, wherein the second design parameter slider includes a second indicator curve that indicates a second correlation between a second range of design parameter values and a second range of expression levels with which the first robot model performs the first behavior when configured according to specific design parameter values within the second range of design parameter values, and evaluating the first mapping across the second range of design parameter values to update the second indicator curve in response to receiving the second user input.

17. The non-transitory computer-readable medium of any of clauses 11-16, wherein the step of modifying the first set of design parameter values comprises modifying a first design parameter value included in the first set of design parameter values to generate a second design parameter value, evaluating the first mapping based on the second design parameter value to generate an estimated expression level with which the first robot model should perform the first behavior when configured according to the second design parameter value, and determining that the estimated expression level is equivalent to the second expression level, wherein the second set of design parameter values includes the second design parameter value.

18. The non-transitory computer-readable medium of any of clauses 11-17, further comprising locking a subset of design parameter values included in the first set of design parameter values in response to second user input, wherein the subset of design parameter values is not modified during modification of the first set of design parameter values.

19. The non-transitory computer-readable medium of any of clauses 11-18, wherein the first robot model comprises a model of a quadruped or a model of a robotic arm.

20. Some embodiments include a system, comprising a memory storing a design pipeline, and one or more processors coupled to the memory that, when executing the design pipeline, are configured to perform the steps of generating a first mapping based on a plurality of sets of design parameter values, wherein the first mapping indicates that a first robot model configured according to a first set of design parameter values performs a first behavior with a first expression level, generating a first behavior slider with which a user interacts to modify an expression level with which the first robot model performs the first behavior, wherein the first behavior slider indicates different expression levels with which the first robot model performs the first behavior when configured according to different sets of design parameter values, receiving first user input via the first behavior slider indicating that the first robot model should perform the first behavior with a second expression level, and modifying the first set of design parameter values based on the first mapping to generate a second set of design parameter values, wherein the first robot model performs the first behavior with the second expression level when configured according to the second set of design parameter values.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for automatically generating design parameter values when designing a robot, the method comprising:
   generating a first mapping that indicates that a first robot model, when configured according to a first set of design parameter values that includes a first value for a first design parameter, performs a first behavior with a first expression level;
   generating, based on the first mapping, a first indicator curve associated with a first design parameter slider that indicates an expression level with which the robot model performs the first behavior as a function of the first design parameter;
   receiving first user input via the first design parameter slider indicating that the first robot model should perform the first behavior according to a second value for the first design parameter instead of the first value for the first design parameter; and
   modifying the first set of design parameter values based on the first user input to generate a second set of design parameter values that includes the second value for the first design parameter, wherein the first robot model, when configured according to the second set of design parameter values, performs the first behavior with a second expression level.

2. The computer-implemented method of claim 1, wherein the first design parameter slider is displayed with the first indicator curve, wherein the first indicator curve indicates a first correlation between a first range of design parameter values and a first range of expression levels with which the first robot model performs the first behavior when configured according to specific design parameter values within the first range of design parameter values, and wherein, in response to the user input received via the first design parameter slider associated with the first design parameter and the first indicator curve, one or more other indicator curves associated with other design parameters are automatically updated.

3. The computer-implemented method of claim 2, further comprising evaluating the first mapping across the first range of design parameter values to generate the first indicator curve.

4. The computer-implemented method of claim 2, further comprising updating the first indicator curve to include a first error bound that indicates an uncertainty level associated with the first correlation.

5. The computer-implemented method of claim 2, wherein the first design parameter slider initially occupies a first position corresponding to a first design parameter value, and further comprising:
   receiving second user input via the first design parameter slider, wherein the second user input indicates a second design parameter value;

causing the first design parameter slider to occupy a second position corresponding to the second design parameter value in response to the second user input; and configuring the first robot model according to the second design parameter value to perform the first behavior with a third expression level.

6. The computer-implemented method of claim 2, further comprising generating a second design parameter slider with which the user interacts to modify a second design parameter, wherein the second design parameter slider includes a second indicator curve that indicates a second correlation between a second range of design parameter values and a second range of expression levels with which the first robot model performs the first behavior when configured according to specific design parameter values within the second range of design parameter values.

7. The computer-implemented method of claim 1, wherein modifying the first set of design parameter values comprises:

modifying a first design parameter value included in the first set of design parameter values to generate a second design parameter value;

evaluating the first mapping based on the second design parameter value to generate an estimated expression level with which the first robot model should perform the first behavior when configured according to the second design parameter value; and determining that the estimated expression level is equivalent to the second expression level, wherein the second set of design parameter values includes the second design parameter value.

8. The computer-implemented method of claim 1, further comprising locking a first design parameter value in response to second user input, wherein the first design parameter value is not modified during modification of the first set of design parameter values.

9. The computer-implemented method of claim 1, further comprising:

generating a first behavior selector with which a user interacts to select the first behavior; and updating the first behavior selector based on second user input to indicate the first behavior.

10. The computer-implemented method of claim 1, wherein generating the first mapping comprises iteratively performing a regression operation between the first expression level and different sets of design parameter values included in the plurality of design parameter values.

11. One or more non-transitory computer-readable media medium storing program instructions that, when executed by one or more processors, cause the one or more processors to automatically generate design parameter values when designing a robot by performing the steps of:

generating a first mapping that indicates that a first robot model, when configured according to a first set of design parameter values that includes a first value for a first design parameter, performs a first behavior with a first expression level;

generating, based on the first mapping, a first indicator curve associated with a first design parameter slider that indicates an expression level with which the robot model performs the first behavior as a function of the first design parameter;

receiving first user input via the first design parameter slider indicating that the first robot model should perform the first behavior according to a second value for the first design parameter instead of the first value for the first design parameter; and modifying the first set of design parameter values based on the first user input to generate a second set of design parameter values that includes the second value for the first design parameter, wherein the first robot model, when configured according to the second set of design parameter values, performs the first behavior with a second expression level.

12. The one or more non-transitory computer-readable media of claim 11, wherein the first design parameter slider is displayed with the first indicator curve, wherein the first indicator curve indicates a first correlation between a first range of design parameter values and a first range of expression levels with which the first robot model performs the first behavior when configured according to specific design parameter values within the first range of design parameter values, and wherein, in response to the user input received via the first design parameter slider associated with the first design parameter and the first indicator curve, one or more other indicator curves associated with other design parameters are automatically updated.

13. The one or more non-transitory computer-readable media of claim 12, further comprising evaluating the first mapping across the first range of design parameter values to generate the first indicator curve.

14. The one or more non-transitory computer-readable media of claim 12, further comprising updating the first indicator curve to include a first error bound that indicates an uncertainty level associated with the first correlation.

15. The one or more non-transitory computer-readable media of claim 12, wherein the first design parameter slider initially occupies a first position corresponding to a first design parameter value, and further comprising:

receiving second user input via the first design parameter slider, wherein the second user input indicates a second design parameter value;

causing the first design parameter slider to occupy a second position corresponding to the second design parameter value in response to the second user input; and configuring the first robot model according to the second design parameter value to perform the first behavior with a third expression level.

16. The one or more non-transitory computer-readable media of claim 15, further comprising:

generating a second design parameter slider with which the user interacts to modify a second design parameter, wherein the second design parameter slider includes a second indicator curve that indicates a second correlation between a second range of design parameter values and a second range of expression levels with which the first robot model performs the first behavior when configured according to specific design parameter values within the second range of design parameter values; and evaluating the first mapping across the second range of design parameter values to update the second indicator curve in response to receiving the second user input.

17. The one or more non-transitory computer-readable media of claim 11, wherein the step of modifying the first set of design parameter values comprises:

modifying a first design parameter value included in the first set of design parameter values to generate a second design parameter value;

evaluating the first mapping based on the second design parameter value to generate an estimated expression level with which the first robot model should perform the first behavior when configured according to the second design parameter value; and determining that the estimated expression level is equivalent to the second expression level, wherein the second set of design parameter values includes the second design parameter value.

18. The one or more non-transitory computer-readable media medium of claim 11, further comprising locking a subset of design parameter values included in the first set of design parameter values in response to second user input, wherein the subset of design parameter values is not modified during modification of the first set of design parameter values.

19. The one or more non-transitory computer-readable media of claim 11, wherein the first robot model comprises a model of a quadruped or a model of a robotic arm.

20. A system, comprising:
one or more memories storing a design pipeline; and
one or more processors coupled to the memory that, when executing the design pipeline, are configured to perform the steps of:

generating a first mapping that indicates that a first robot model, when configured according to a first set of design parameter values that includes a first value for a first design parameter, performs a first behavior with a first expression level;

generating, based on the first mapping, a first indicator curve associated with a first design parameter slider that indicates an expression level with which the robot model performs the first behavior as a function of the first design parameter;

receiving first user input via the first design parameter slider indicating that the first robot model should perform the first behavior according to a second value for the first design parameter instead of the first value for the first design parameter; and modifying the first set of design parameter values based on the first user input to generate a second set of design parameter values that includes the second value for the first design parameter, wherein the first robot model, when configured according to the second set of design parameter values, performs the first behavior with a second expression level.

* * * * *

UNITED STATES PATENT AND TRADEMARK OFFICE
CERTIFICATE OF CORRECTION

PATENT NO. : 11,518,040 B2
APPLICATION NO. : 16/134864
DATED : December 6, 2022
INVENTOR(S) : Fraser Anderson et al.

It is certified that error appears in the above-identified patent and that said Letters Patent is hereby corrected as shown below:

In the Claims

Column 25, Claim 11, Line 51, please delete "mcdium";

Column 27, Claim 18, Line 9, please delete "mcdium".

Signed and Sealed this
Twenty-first Day of February, 2023

*Katherine Kelly Vidal*

Katherine Kelly Vidal
*Director of the United States Patent and Trademark Office*